(12) United States Patent  (10) Patent No.: US 8,212,430 B2
McCoy  (45) Date of Patent: Jul. 3, 2012

(54) APPARATUS AND SYSTEM FOR COMMUNICATING ELECTROMAGNETIC SERVICE

(75) Inventor: Richard A. McCoy, Stevensville, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 287 days.

(21) Appl. No.: 12/643,331

(22) Filed: Dec. 21, 2009

(65) Prior Publication Data

US 2011/0148216 A1 Jun. 23, 2011

(51) Int. Cl.
 *H02B 1/00* (2006.01)
(52) U.S. Cl. .... 307/154; 361/600; 361/601; 361/679.01
(58) Field of Classification Search .......... 361/600–601, 361/679.01, 728–733; 307/154
 See application file for complete search history.

(56) References Cited

U.S. PATENT DOCUMENTS

| | | |
|---|---|---|
| 3,101,984 A | 8/1963 | Wieckmann |
| 4,148,536 A | 4/1979 | Petropoulsos et al. |
| 4,591,732 A | 5/1986 | Neuenschwander |
| 5,385,468 A | 1/1995 | Verderber |
| 5,433,623 A | 7/1995 | Wakata et al. |
| 5,713,752 A | 2/1998 | Leong et al. |
| 6,176,718 B1 | 1/2001 | Skarie et al. |
| 6,428,334 B1 | 8/2002 | Skarie et al. |
| 7,024,717 B2 | 4/2006 | Hilscher et al. |
| 7,207,080 B2 | 4/2007 | Hilscher et al. |
| 7,354,292 B1 | 4/2008 | Lloyd et al. |
| 7,404,298 B2 * | 7/2008 | Kim et al. .................. 62/126 |
| 7,618,295 B2 * | 11/2009 | McCoy ...................... 439/676 |
| 7,625,246 B2 * | 12/2009 | McCoy et al. .............. 439/676 |
| 7,639,485 B2 * | 12/2009 | McCoy .................. 361/679.29 |
| 7,651,368 B2 * | 1/2010 | Kendall et al. ............. 439/527 |
| 7,686,127 B2 * | 3/2010 | LeClear et al. ............. 181/150 |
| 7,713,090 B2 * | 5/2010 | Kendall et al. ............. 439/628 |
| 7,740,505 B2 * | 6/2010 | McCoy ...................... 439/660 |
| 7,740,506 B2 * | 6/2010 | McCoy ...................... 439/676 |
| 7,748,494 B2 * | 7/2010 | Leclear et al. ............. 181/150 |
| 7,751,184 B2 * | 7/2010 | McCoy .................. 361/679.41 |
| 7,765,332 B2 * | 7/2010 | McCoy et al. ................ 710/2 |
| 7,798,865 B2 * | 9/2010 | McCoy et al. .............. 439/676 |
| 7,810,343 B2 * | 10/2010 | McCoy et al. ............... 62/331 |
| 7,826,203 B2 * | 11/2010 | McCoy .................. 361/679.01 |
| 7,841,907 B2 * | 11/2010 | McCoy ...................... 439/676 |
| 7,843,697 B2 * | 11/2010 | McCoy et al. .............. 361/728 |
| 7,852,619 B2 * | 12/2010 | McCoy .................. 361/679.01 |
| 7,865,639 B2 * | 1/2011 | McCoy et al. ............... 710/62 |
| 7,869,201 B2 * | 1/2011 | McCoy et al. .......... 361/679.07 |
| 7,870,753 B2 * | 1/2011 | Marcy et al. ................ 62/331 |

(Continued)

FOREIGN PATENT DOCUMENTS

EP 0868077 A2 9/1998

(Continued)

*Primary Examiner* — Adi Amrany
(74) *Attorney, Agent, or Firm* — Robert A. Bacon; McGarry Bair PC

(57) ABSTRACT

An electromagnetic service communicating device for coupling to a host in at least two distinct orientations as well as a modular system including a host and a functional device. The electromagnetic service communicating device provides electromagnetic service from the host to the functional device. The electromagnetic service communicating device includes a first member having a first interface connectable to the host and that is pivotally connected to a second member having a second interface connectable to the functional device. The hosts can have differently oriented electromagnetic service interfaces.

35 Claims, 11 Drawing Sheets

U.S. PATENT DOCUMENTS

| | | | |
|---|---|---|---|
| 7,871,300 B2 * | 1/2011 | McCoy et al. ............... 439/676 |
| 7,898,812 B2 * | 3/2011 | McCoy et al. ............... 361/728 |
| 7,903,397 B2 * | 3/2011 | McCoy ................... 361/679.01 |
| 7,916,336 B2 * | 3/2011 | Silverbrook et al. ........ 358/1.15 |
| 7,931,114 B2 * | 4/2011 | LeClear et al. ............... 181/150 |
| 7,934,958 B2 * | 5/2011 | Kendall et al. ............... 439/628 |
| 7,980,088 B2 * | 7/2011 | LeClear et al. ................. 62/331 |
| 8,008,586 B2 * | 8/2011 | Kuehl et al. ................. 200/51 R |
| 8,035,958 B2 * | 10/2011 | Kendall et al. .......... 361/679.21 |
| 8,040,666 B2 * | 10/2011 | McCoy et al. .......... 361/679.01 |
| 2004/0154318 A1 | 8/2004 | Roh et al. |
| 2006/0118694 A1 * | 6/2006 | Lee et al. ..................... 248/923 |
| 2006/0125360 A1 * | 6/2006 | Kim et al. .................. 312/405.1 |
| 2006/0168236 A1 | 7/2006 | Higuma et al. |
| 2007/0086151 A1 * | 4/2007 | Oh et al. ....................... 361/680 |
| 2008/0164224 A1 * | 7/2008 | McCoy et al. ................ 211/26.1 |
| 2008/0164225 A1 * | 7/2008 | McCoy ........................ 211/26.1 |
| 2008/0164226 A1 * | 7/2008 | McCoy et al. ................ 211/26.1 |
| 2008/0164227 A1 * | 7/2008 | LeClear et al. ............... 211/26.1 |
| 2008/0164796 A1 * | 7/2008 | McCoy et al. ................ 312/405 |
| 2008/0165282 A1 * | 7/2008 | Marcy et al. ................. 348/552 |
| 2008/0165474 A1 * | 7/2008 | McCoy et al. ................. 361/679 |
| 2008/0165475 A1 * | 7/2008 | McCoy et al. ................. 361/679 |
| 2008/0165476 A1 | 7/2008 | McCoy et al. |
| 2008/0165505 A1 * | 7/2008 | McCoy et al. ................. 361/725 |
| 2008/0165509 A1 * | 7/2008 | Kendall et al. ............... 361/735 |
| 2008/0166895 A1 * | 7/2008 | McCoy et al. ................... 439/11 |
| 2008/0166915 A1 * | 7/2008 | Kendall et al. ............... 439/527 |
| 2008/0168205 A1 * | 7/2008 | McCoy et al. ................ 710/304 |
| 2008/0192411 A1 * | 8/2008 | McCoy ......................... 361/679 |
| 2008/0222327 A1 * | 9/2008 | McCoy et al. ................... 710/64 |
| 2008/0231764 A1 * | 9/2008 | Kendall et al. ................ 348/836 |
| 2008/0232053 A1 * | 9/2008 | Kendall et al. ................ 361/681 |
| 2008/0247141 A1 * | 10/2008 | Kendall et al. ................ 361/729 |
| 2009/0009316 A1 * | 1/2009 | Kendall et al. ................ 340/500 |
| 2010/0182753 A1 * | 7/2010 | Kendall et al. ................ 361/729 |
| 2010/0248546 A1 * | 9/2010 | McCoy ..................... 439/620.21 |
| 2011/0146328 A1 * | 6/2011 | Hendrickson et al. .......... 62/389 |
| 2011/0146329 A1 * | 6/2011 | Kuehl et al. ..................... 62/389 |
| 2011/0146330 A1 * | 6/2011 | Kuehl et al. ..................... 62/389 |
| 2011/0146819 A1 * | 6/2011 | Hendrickson et al. .... 137/561 R |
| 2011/0147161 A1 * | 6/2011 | Kuehl et al. .................. 192/82 R |
| 2011/0147417 A1 * | 6/2011 | Kuehl ............................ 222/192 |
| 2011/0148223 A1 * | 6/2011 | McCoy ......................... 307/116 |
| 2011/0148649 A1 * | 6/2011 | de Cavalcanti et al. .... 340/686.6 |
| 2011/0148650 A1 * | 6/2011 | Jenkins et al. ............. 340/686.6 |
| 2011/0148651 A1 * | 6/2011 | Hendrickson et al. ...... 340/686.6 |
| 2011/0149485 A1 * | 6/2011 | Kuehl et al. .............. 361/679.01 |
| 2011/0152024 A1 * | 6/2011 | Kuehl ............................ 474/166 |
| 2011/0153739 A1 * | 6/2011 | McCoy ......................... 709/204 |
| 2011/0153821 A1 * | 6/2011 | McCoy ......................... 709/225 |
| 2011/0153871 A1 * | 6/2011 | Ferragut et al. ................... 710/8 |
| 2011/0153880 A1 * | 6/2011 | McCoy ........................... 710/33 |

FOREIGN PATENT DOCUMENTS

| | | |
|---|---|---|
| JP | 60033716 A | 2/1985 |
| JP | 06310202 A | 11/1994 |
| JP | 06310204 A | 11/1994 |
| JP | 06333633 A | 12/1994 |
| JP | 2007080584 A | 3/2007 |
| WO | 2007/015274 A1 | 2/2007 |

* cited by examiner

APPARATUS AND SYSTEM FOR COMMUNICATING ELECTROMAGNETIC SERVICE

BACKGROUND

Traditionally, appliances, consumer electronics devices, and other useful household equipment are located in a room dedicated to the function supported by the appliance, consumer electronic device, and/or household equipment. For example, the kitchen has traditionally been limited to a space for preparing and eating meals and consequently has mostly been occupied by cabinetry and large home appliances such as refrigerators, dishwashers, and ovens. The family room has been designated as a place for leisure activities, and so most entertainment devices, such as televisions and video games are commonly found here. Laundry rooms normally house a washer, dryer, and iron. Devices such as personal computers and printers are often located in another room, such as a dedicated home office or bedroom.

Consumers increasingly own multiple hand-held or portable consumer electronic devices, such as laptops, cell phones, PDA's, and digital music players. These devices are typically used in many different rooms in the house and are often carried from room to room throughout the home. Consumers also tend to perform nontraditional tasks in the traditional rooms of the home. For example, consumers also tend to eat in the living room or media room, instead of the dining room. Consumers tend to eat, meet and entertain in the kitchen, not just in the dining room and family room. In fact, the kitchen is often the hub of most household activity. Consumers also tend to work in every room of the home with the adoption of laptop computers and wireless networks. Therefore, there is a trend for consumers to perform non-traditional functions in a household room designed for a traditional function. The present invention recognizes this trend and attempts to support the trend.

SUMMARY

An electromagnetic service communicating device and a modular system are disclosed. The electromagnetic service communicating device enables the electromagnetic service communicating device to be attached to hosts that have differently oriented electromagnetic service interfaces. For example, a first host, like a refrigerator, might have an upwardly oriented electromagnetic service interface and a second host, like a wall, might have an outwardly oriented electromagnetic service interface.

According to one aspect of the invention, an electromagnetic service communicating device mounts to a host having a horizontal surface with an upwardly oriented host electromagnetic service interface providing at least one electromagnetic service. The electromagnetic service communicating device comprises a first member comprising a functional device, a second member having a second electromagnetic service interface capable of removably coupling with the host electromagnetic service interface and communicating the at least one electromagnetic service with the host electromagnetic service interface, and a service pathway operably coupling the second electromagnetic service interface with the functional device for the communication of an electromagnetic service therebetween, wherein the second member is pivotally connected to the first member.

According to another aspect of the invention, an adapter mounts a functional device to a host having a horizontal surface with an upwardly oriented host electromagnetic service interface providing at least one electromagnetic service. The adapter comprises a first member capable of supporting a functional device, a second member having an electromagnetic service interface capable of removably coupling with the host electromagnetic service interface and receiving the at least one electromagnetic service from the host electromagnetic service interface, wherein the second member is pivotally connected to the first member for movement between a first orientation having a first angular relationship between the first and second members, and a second orientation having a second angular relationship between the first and second members different than the first angular relationship, and a service pathway configured to communicate the at least one electromagnetic service between the first and second members in both the first and second orientation of the second member.

According to yet another aspect of the invention, an electromagnetic communicating device mounts a functional device to a host electromagnetic service interface capable of providing mechanical support service and at least one electromagnetic service. The electromagnetic communicating device comprises a first member having a first electromagnetic service interface oriented in a first direction and capable of removably coupling with the host electromagnetic service interface and capable of receiving the at least one mechanical support service and capable of communicating the at least a first electromagnetic service from the host electromagnetic service interface, a second member having a device electromagnetic service interface capable of removably coupling with the functional device and capable of providing the functional device with mechanical support service and capable of communicating at least a second electromagnetic service with the functional device, a hinge system pivotally connecting the first member to the second member to movably support the second member in a plurality of relative angular orientations, and a service pathway connecting the first and second electromagnetic service interfaces and capable of communicating at a third electromagnetic service therebetween.

According to yet another aspect of the invention, a modular system communicates an electromagnetic service and comprises a host having a host electromagnetic service interface capable of providing a mechanical support service and communicating at least one electromagnetic service, the host electromagnetic service interface having one of a vertical orientation and a horizontal orientation, and a service communicating device removably coupled with the hose and which comprises a first member having a device electromagnetic service interface capable of removably coupling with the host electromagnetic service interface to receive the mechanical service and communicate the at least one electromagnetic service, and a second member capable of supporting a functional device, the second member pivotally connected to the first member to move between at least a first position for connecting to the host electromagnetic service interface having the vertical orientation, and a second position for connecting to the host electromagnetic service interface having the horizontal orientation.

DETAILED DESCRIPTION

Figure 1:
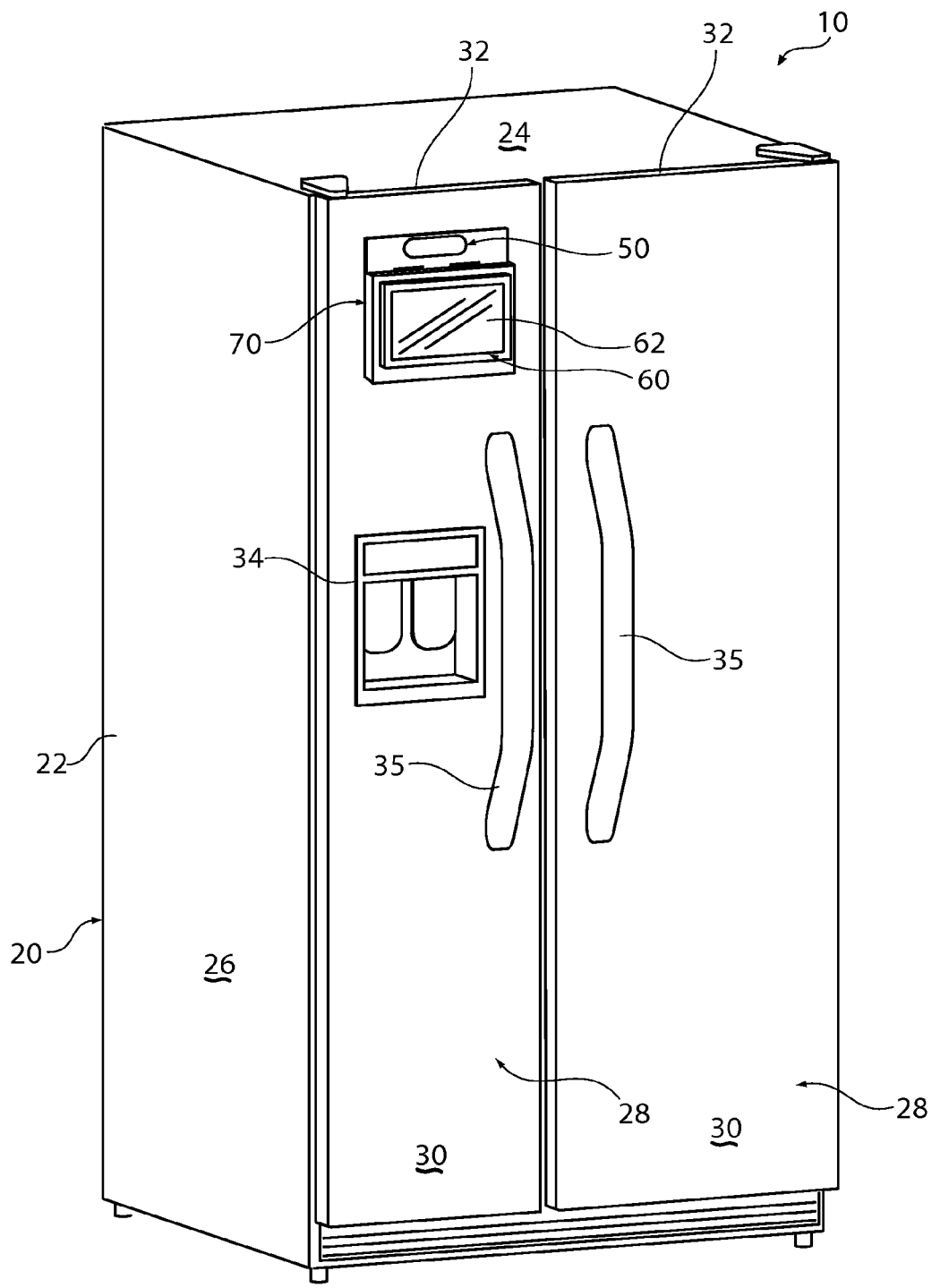
FIG. 1 is a perspective view of a first embodiment of a modular system comprising a host, such as a refrigerator, an electromagnetic service communicating device including a functional device, an adapter for holding the functional device, and an interface cover.

Referring now to the discussion that follows and also to the drawings, illustrative approaches to the disclosed systems and methods are shown in detail. Although the drawings represent some possible approaches, the drawings are not necessarily to scale and certain features may be exaggerated, removed, or partially sectioned to better illustrate and explain the present invention. Further, the descriptions set forth herein are not intended to be exhaustive or to otherwise limit or restrict the claims to the precise forms and configurations shown in the drawings and disclosed in the following detailed description.

The drawings and the following detailed description relate generally to electromagnetic service communicating devices for coupling with hosts in at least two distinct orientations. The electromagnetic service communicating device may be a consumer electronic device, an adapter for coupling a functional device to a host, or a functional unit of an adapter and a functional device.

As used herein, a "service" is a useful functionality that may be communicated from one device to another device, such as electrical power, electronic data, mechanical support, mechanical power, mechanical motion, thermal energy, illumination, sound, fluid power, or a substance. A service may comprise multiple categories of service, such as electrical power and data in a single signal. A service may be provided continuously or for specified times or for specified amounts or for the duration of certain events, such as the duration of coupling, such as to provide timed dispensing. Alternatively, service may be provided in quanta, such, as packets of data, doses of substances, batches of discrete items such as tablets, or consumable components.

As used herein, an "electromagnetic service" is electrical power or data. An electromagnetic service may comprise multiple categories of service, such as electrical power and data in a single signal. An electromagnetic service may be provided continuously, for specified times, for specified amounts, or for the duration of certain events, such as the duration of coupling to provide timed dispensing. Alternatively, an electromagnetic service may be provided in quanta, such as packets of data.

The term "coupled" and any variation thereof, as used herein, includes any type of connection that permits transfer of a service, as hereinafter defined, between two devices. The term "coupled" does not require a physical connection between the two devices so long as the coupling permits transfer of a service. The term "coupled" includes both fixed and removable coupling, as well as both continuous and intermittent coupling.

"Electrical power communication" is the coupling of two devices to supply electrical power from at least one of the devices to the other of the devices, such as through directly connected electronic lines or through wireless power communication (also referred to as wireless power transmission). Wireless power communication may include any type of wireless power communication, including, without limitation for illustration purposes, microwave transmission, laser transmission, and magnetic fields. Exemplary categories of power communication include the type of power, e.g. alternating current (also known as AC) or direct current (also known as DC), supplied to a functional device (defined below) and variations in the characteristics of the power, such as the voltage or current.

"Data communication" is the coupling of two devices to transmit data from at least one of the devices to the other of the devices, such as through directly connected electronic lines or through wireless data communication (also referred to as wireless data transmission). The data may be transmitted as a separate signal or embedded in electrical power communication. Wireless data communication may include any type of wireless data communication, including, without limitation for illustration purposes, wireless network (a/k/a Wi-Fi), radio transmission, light transmission, and acoustical transmission. Exemplary categories of data communication include encrypted and unencrypted data. Data communication also includes communication for different protocols, including physical layer protocols and software layer protocols. Examples of physical layer protocols are a wired Ethernet and a wireless (Wi-Fi) network, both of which may support the same data packet structure. Examples of software layer protocol are Zigbee® and Bluetooth®. Data communication may also be completed by way of an analog mechanical transmission means such as by means of fluidic pulses created by positive pressure systems or vacuum systems or by a mechanical logic transfer means, such as the throwing of switches or levers to actuate or transmit information about a control state.

"Communicating" an electromagnetic service, and any variation thereof, as used herein, means supplying or receiving an electromagnetic service. As used herein, communication of electromagnetic service includes both uni-directional and multi-directional communication between any two devices, either directly or through an adapter, as defined herein.

"Wireless" refers to a type of communication in which power and/or data is transferred over a distance without the use of electrical conductors or wires. For example, electromagnetic waves, light waves, or acoustic waves can be used to carry power and/or data over a distance without using electrical conductors or wires.

As used herein, a "substance" is a material that may be communicated from one device to another. A substance may include a gas, a liquid, or a solid, or any combination thereof. Examples of substances include, but are not limited to, liquid soap, powdered soap, compressed air, tablets, caplets, water, ice cubes, a beverage, as well as others.

As used herein, "substance communication" or a "substance communication service" is a useful provision of a substance from one device to another device. Communicating a substance includes supplying or receiving a substance. As used herein, communication of substance includes both uni-directional and multi-directional communication between any two devices, either directly or through an adapter, as defined herein. Substance communication may be provided in quanta, such as capsules or other doses of substances, batches of discrete items such as tablets, or consumable components.

The terms "provide" and "supply" and any variation thereof, are used herein to denote a source of the electromagnetic service relative to a device receiving the electromagnetic service. Neither term is limited to the original source of the electromagnetic service. A device that provides or supplies the electromagnetic service may simply be passing on the electromagnetic service from the original source, such as a residential power utility system or the internet. For example, a device that provides an electrical power service may pass on electricity it receives from a household outlet. However, the device may, alternatively or additionally, provide another electromagnetic service that originates with the device, such as a data service.

The term "receive" and any variation thereof, is used herein to denote receipt of the electromagnetic service relative to the device providing the electromagnetic service. The term is not limited to the ultimate consumer of the service. A device that receives the electromagnetic service may simply be passing on the electromagnetic service from the source, such as an appliance, to a device that will consume, as hereinafter defined, the electromagnetic service. The device that receives an electromagnetic service is not necessarily the end consumer of the electromagnetic service.

The term "consume" and any variation thereof, as used herein, denotes the act of employing or dispensing at least a portion of the electromagnetic service received in connection with performing a function, such as using a power service to operate a speaker or video display.

A "useful device" as used herein is a device that is capable of performing a useful physical or virtual function either alone or in combination with another device.

An "electromagnetic service consumer" as used herein is any useful device that employs, uses, stores, or dispenses an electromagnetic service in connection with performing a physical or virtual function. An electromagnetic service consumer may be, for example, a consumer electronic device, a client software device, a remote user interface, a source of consumer information, a reader, such as a bar code, optical scanner or RFID reader, a sensor device, a smart utensil, an appliance, an additional smart coupling device, a remote controller, a network binder, a cycle accessory, a resource controller, such as an energy controller, a communicator, such as an audible accessory, an access or payment system, such as a smart card system permitting access to a host device, a sales demonstration device, an electromagnetic service holder, such as a battery, a dispenser, a media content holder, or an electromagnetic service device, such as a laptop or other service client.

An "electromagnetic service provider" as used herein is any useful device that is capable of providing or supplying an electromagnetic service to another device.

An "electromagnetic service communicating device" as used herein is any useful device that is capable of communicating an electromagnetic service with another device, and may be an electromagnetic service provider or an electromagnetic service consumer.

A "host" as used herein is an electromagnetic service provider that has a primary function independent of providing an electromagnetic service. For example, the host may be an appliance and the primary function may be performing a series of steps to conduct a useful cycle of operation. The appliance may be a conventional household appliance, such as a refrigerator performing a cooling cycle or an ice making cycle. Other examples of appliances that may be hosts include, but are not limited to, a freezer, a conventional oven, a microwave oven, a dishwashing machine, a stove, a range, an air conditioner, a dehumidifier, a clothes washing machine, a clothes dryer, a clothes refreshing machine, and a non-aqueous washing apparatus, or any combination thereof. Alternatively, the host may be a fixture such as a water softener, a water heater, a furnace, pool water treatment equipment, or an HVAC system. The host may be a small device such as a thermostat, a blender, a mixer, a toaster, a coffee maker, an air purifier, an iron, a vacuum cleaner, a robot, or a trash compactor. The host may alternatively comprise a structural feature of a building, such as a wall, a cabinet, or a door. Still other alternative hosts may include furniture, such as a desk or a sofa, a part of a vehicle such as a car dashboard, an air craft passenger seat, a bicycle handle, and a shopping cart handle. The host may also provide other services, such as mechanical power, illumination, heat, or sound. The host may be an electromagnetic service consumer. For example, a host may provide a power service while receiving or while receiving and supplying a data service.

A "functional device" as used herein may be an electromagnetic service provider, an electromagnetic service consumer, or both.

As used herein, the terms "accessory" or "accessory device" refer to any useful device that may be used primarily in conjunction with a host to enhance, supplement, regulate or monitor the functionality of the host. An accessory device may be a service provider, a service consumer, or both. Examples of an accessory device include, but are not limited to, a television, a video camera, a video recorder, a personal computer, a notebook computer, a computer monitor, a video display, a keyboard, a printer, copying equipment, a calculator, a facsimile machine, a scanner, a digital storage device, a wireless transceiver, an internet router, a power supply, a data recorder, an answering machine, a telephone, a cordless telephone, a cellular telephone, a video game system, a personal digital assistant, a DVD player, a VHS player, a VCR, a cassette deck, an 8 mm video player, a CD player, a Blackberry®, a smartphone, a smoke detector, a portable digital video player, an MP3 player, a radio, other music players, an audio speaker, a digital picture frame, a weather station, and a scale or balance.

A "portable device" as used herein is a device that is designed to be moveable by a user during its useful life between a use location and a storage location or alternative use location. A portable device can be an accessory device.

An "independent device" as used herein is a useful device that provides a useful function without being connected to a service provider. In some cases, the primary function of the independent device is different from the primary function of the host from which the independent device may receive a service. The independent device may be a consumer electronic device, such as portable communication, entertainment, informational or educational devices.

A "dependent device" as used herein is a useful device that provides a useful function only when connected to a service provider. A dependent device may be a service consumer. Examples of dependent service consumers that may be coupled to a host include a remote user interface (UI), a consumable reader, a cooking sensor, a smart pan or pot, a smart dimmer, a cycle accessory, an energy controller, an audible accessory, a laundry payment or smart card system, a sales demonstration unit, or a service laptop or other service client.

A "plug" as used herein is a generally male electromagnetic service connection component.

A "receptacle" as used herein is a generally female electromagnetic service connection component.

As used herein, an "electromagnetic service line" or "electromagnetic service pathway" is a pathway for transferring an electromagnetic service from one location to another. The electromagnetic service line may have any of a variety of configurations, including, but not limited to, a pipe, a conduit, a wire, a tube, a channel, and a fiber optic cable. More particularly, to transfer electrical power or data, an electromagnetic service line may include an electrically conductive wire, an optical data cable, or a wireless transmission system.

An "adapter" as used herein is an intermediate device that may be provided between a first and second useful device, such as between a host and an accessory, to facilitate the communication of services between the first and second useful devices. An adapter may receive an electromagnetic service from the first useful device and provide a modified version of the electromagnetic service to the second useful device, for example, by providing an electrical power service using a different voltage or providing a data service using a different data structure or signal type. In some applications, multiple adapters may be interposed between two useful devices. In other applications, three or more useful devices may be coupled to a single adapter, such as between a host and two accessories. In some applications, the adapter may itself be a functional device providing a useful function not provided by the useful devices coupled to it. An adapter may optionally include a transformative component that transforms a service from a service provider to a different service, which is supplied to a service consumer. This may be useful when the service from the service provider is not compatible with the service consumer. The transformative component can be configured to transform the service into a compatible form for the service consumer. Examples of transformative components are protocol converters, power transformers, or other devices that convert substance, energy, or data from a first form to a second form.

A "functional unit" as used herein is any adapter coupled to a useful device, which together provide a functionality that neither the adapter nor the useful device may alone provide. Any functional unit itself is also included within the meaning of the term "useful device". In some cases, it is contemplated that a dependent device may be coupled with an adapter that provides one or more services required by the dependent device to enable the functional unit to provide a useful function, in which case the functional unit also constitutes an independent device.

A hinged electromagnetic service communicating device and a modular system as illustrated and described in detail herein enables the electromagnetic service communicating device to be attached to hosts that that have differently oriented electromagnetic service interfaces. For example, a first host, such as a refrigerator, might have an upwardly oriented electromagnetic service interface, while a second host, such as a wall, might have an outwardly oriented electromagnetic service interface. The hinged electromagnetic service communicating device may receive service from both the first and second host by adapting its electromagnetic service interface orientation by pivotally moving its electromagnetic service interface. The hinged electromagnetic service communicating device is capable of coupling to a service provider and directly consuming service from the service provider or providing service from the service provider to a functional device that is also a second electromagnetic service communicating device.

As described below, the hinged electromagnetic service communicating device may include a first member having a first interface connectable to the service provider, the first member pivotally connected to a second member having a second interface connectable to the functional device. The modular system may include a plurality of hosts having differently oriented electromagnetic service interfaces and the adapter.

Figure 2:
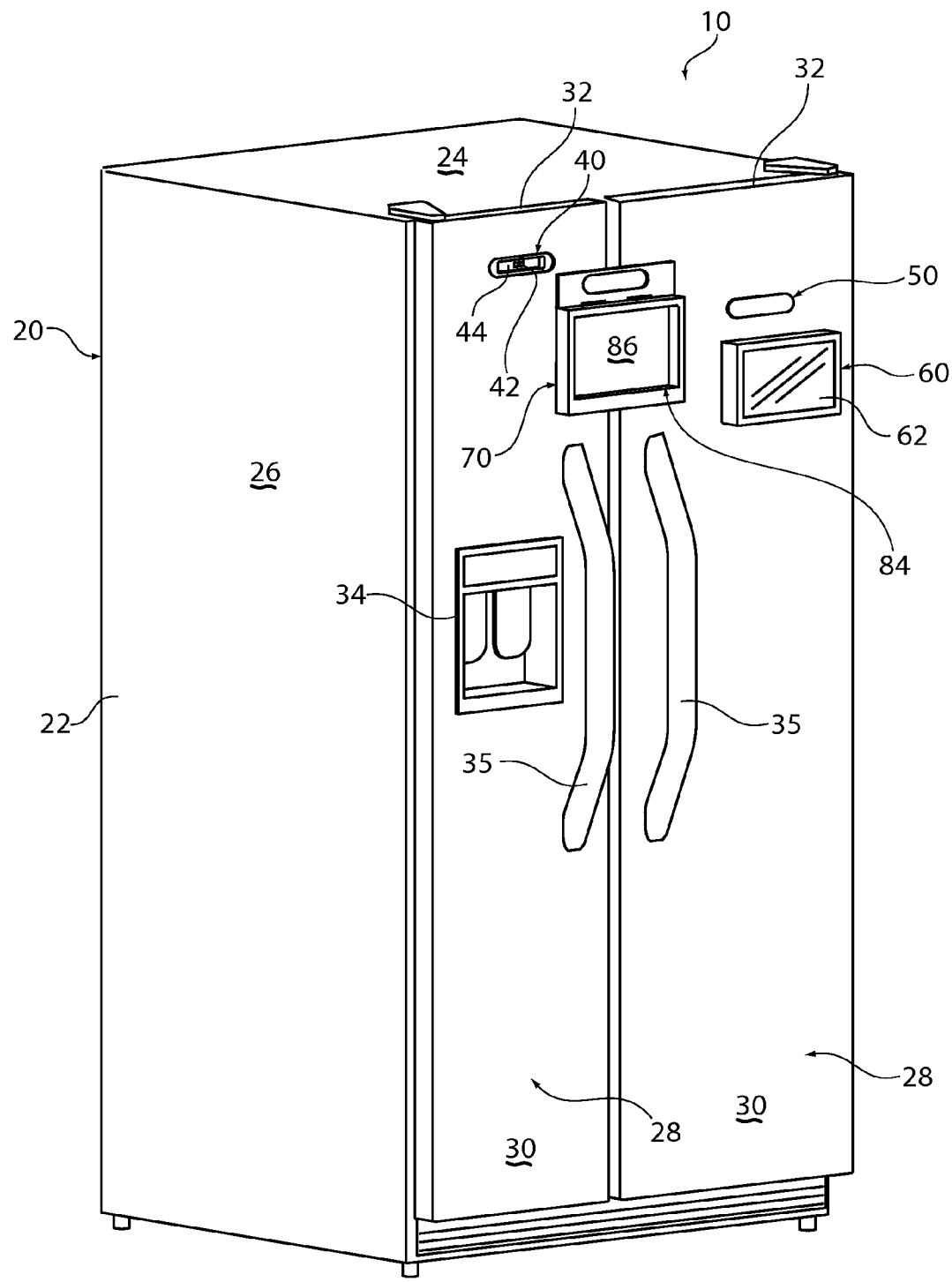
FIG. 2 is an exploded perspective view of the modular system of FIG. 1.
Figure 3:
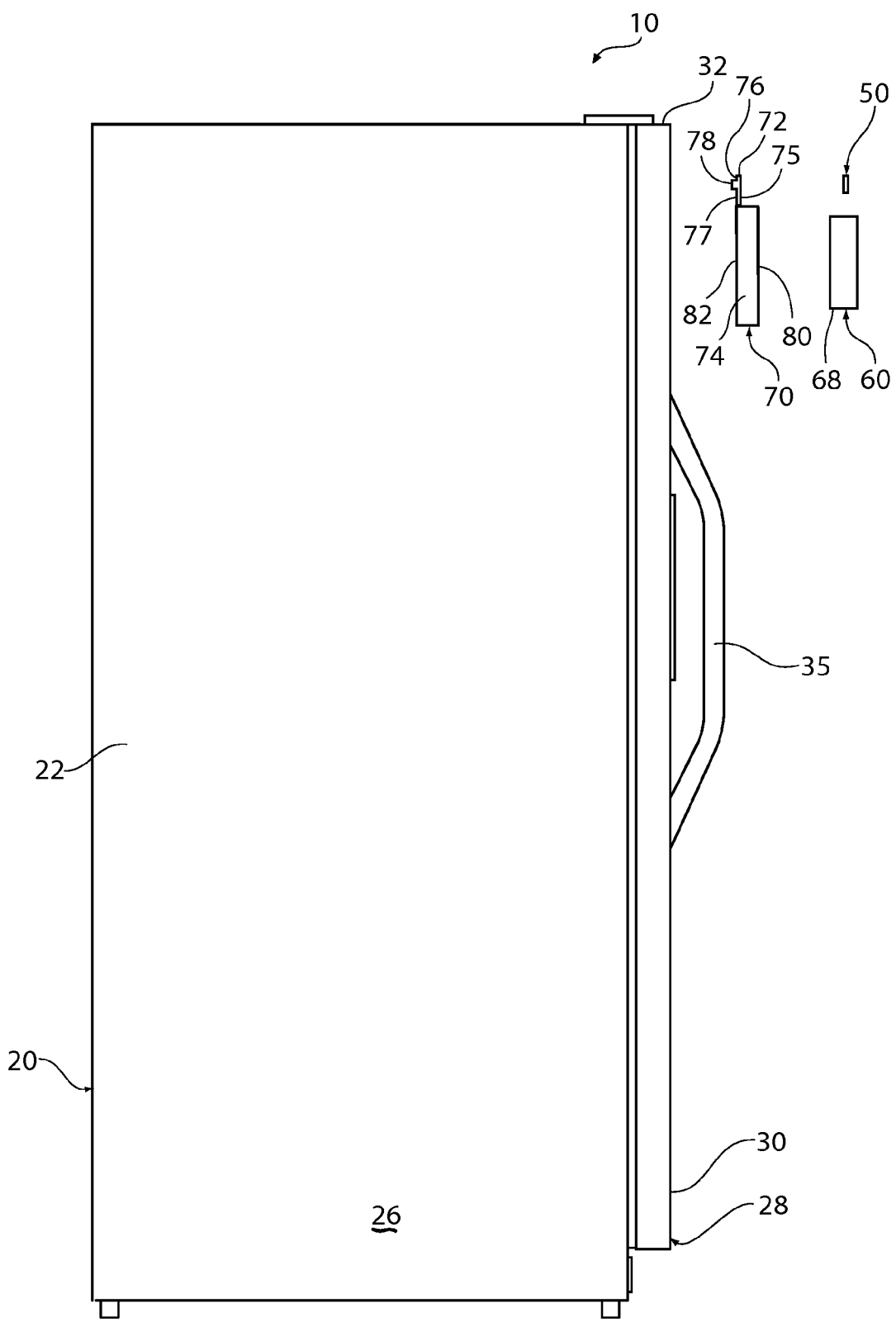
FIG. 3 is an exploded side elevational view of the modular system of FIG. 1.

Referring now to the drawings, FIGS. 1-7 depict a first embodiment of a modular system 10 having a host 20 with a host electromagnetic service interface 40, an adapter 70, and a functional device 60. These components are configured to communicate various electromagnetic services between one another in a manner described in detail herein. With reference to FIGS. 1-2, the adapter 70 is capable of being coupled to the host electromagnetic service interface 40, and the functional device 60, such as a video device, is capable of being coupled to the adapter 70. Host 20 may be a service provider, and functional device 60 and adapter 70 may both be service consumers. Alternatively, functional device 60 may be a service provider and adapter 70 and host 20 may be service consumers. While the embodiment illustrated provides for the functional device 60 to be removable from the adapter 70, it is also contemplated that the functional device 60 may be incorporated into the adapter 70.

The host 20 is a structure capable of providing a mechanical support service. In the modular system 10, the host 20 is an appliance such as a refrigerator. Furthermore, suitable hosts may comprise a structure other than an appliance that can also supply a mechanical support service.

The host 20 provides a mechanical support service to the host electromagnetic service interface 40, which may in turn provide a mechanical support service to the adapter 70, which may in turn provide mechanical support service to the functional device 60. Mechanical support service is the physical direct and indirect coupling of two objects, such as between any combination of the host 20, the adapter 70, and the functional device 60. The mechanical support service includes direct and indirect physical mounting, unless expressly stated otherwise. Physical coupling includes a fixed or removable mounting, unless expressly stated otherwise. As an example, two possible categories of mechanical support services are hanging the functional device 60 as opposed to docking the functional device 60.

The host 20 can comprise a cabinet 22 with various surfaces and features, such as a horizontal top surface 24 and vertical side surface 26, as well as internal surfaces (not shown) within the cabinet 22. The host 20 can further include a pair of doors 28 pivotally connected to the cabinet 22, each door 28 having various surfaces and features such a vertical front face 30, a horizontal top edge 32, and handles 35. One of the doors 28 can comprise an ice and water dispenser 34.

The host electromagnetic service interface 40 may be removable or non-removable from the host 20. For example, the host electromagnetic service interface 40 may be integrally formed with the host 20. Alternatively, the host electromagnetic service interface 40 may be a separate add-on device. As illustrated, the host electromagnetic service interface 40 is provided on one of the surfaces or features of the host 20, such as on the vertical front face 30 of one of the doors 28 as shown in FIGS. 1-7. Alternatively, the host electromagnetic service interface 40 may be provided on the other surfaces and features of the host 20, such as the top surface 24 of the cabinet 22, the side surface 26 of the cabinet 22, the horizontal top edge 32 of the door 28, a control panel of the ice and water dispenser 34, or an inner surface or feature within the cabinet 22. Other hosts (not shown) may have multiple host electromagnetic service interfaces having the same or different orientations and each configured for coupling with the adapter 70.

In addition to the mechanical support service provided to the adapter 70, the host electromagnetic service interface 40 communicates at least one electromagnetic service with the adapter 70. More particularly, when coupled with adapter 70, the host electromagnetic service interface 40 communicates the at least one electromagnetic service with the adapter, either providing or receiving the at least one electromagnetic service to or from the adapter 70. The adapter 70 may in turn use the at least one electromagnetic service and/or communicate the at least one electromagnetic service with the functional device 60.

Where the host 20 is a functional apparatus, such as a refrigerator, using or generating a service, the host 20 may communicate multiple services with the host electromagnetic service interface 40. For example, the ice and water dispenser of the refrigerator illustrated in FIG. 1 may use electrical power, or may use and be capable of providing data, may use and be capable of providing water, and may use a cooling service. Any of these services may be communicated through the host 20 to the host electromagnetic service interface 40 so as to be available to be communicated with the adapter 70. Alternatively, the host electromagnetic service interface 40 may obtain the at least one electromagnetic service through the host 20, but an additional service may be provided from a service source independent of the host 20, such as a home water, power data or other utility system. More generally, services that the host electromagnetic service interface 40 may communicate include any service, as defined above. The service may be communicated between any combination of the host 20, adapter 70, and functional device 60.

Figure 4:
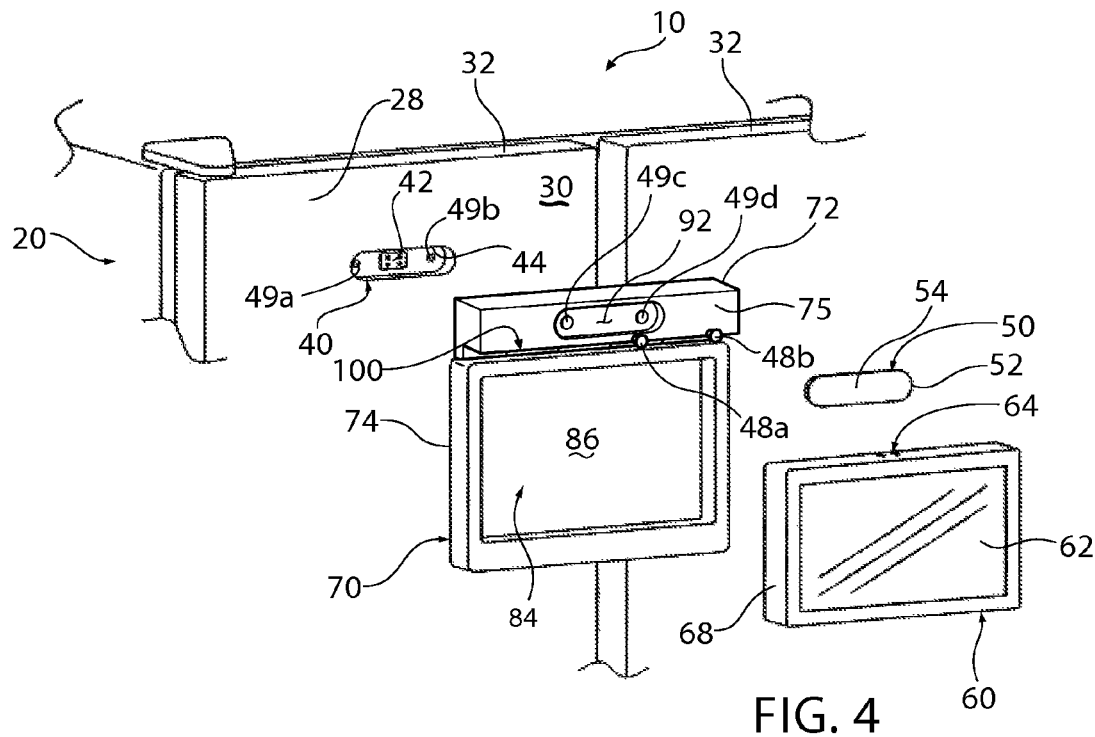
FIG. 4 is an enlarged view of a portion of FIG. 1 showing in an exploded illustration a host interface on a door of the refrigerator, and certain details of the adapter, the functional device and the interface cover.
Figure 5:
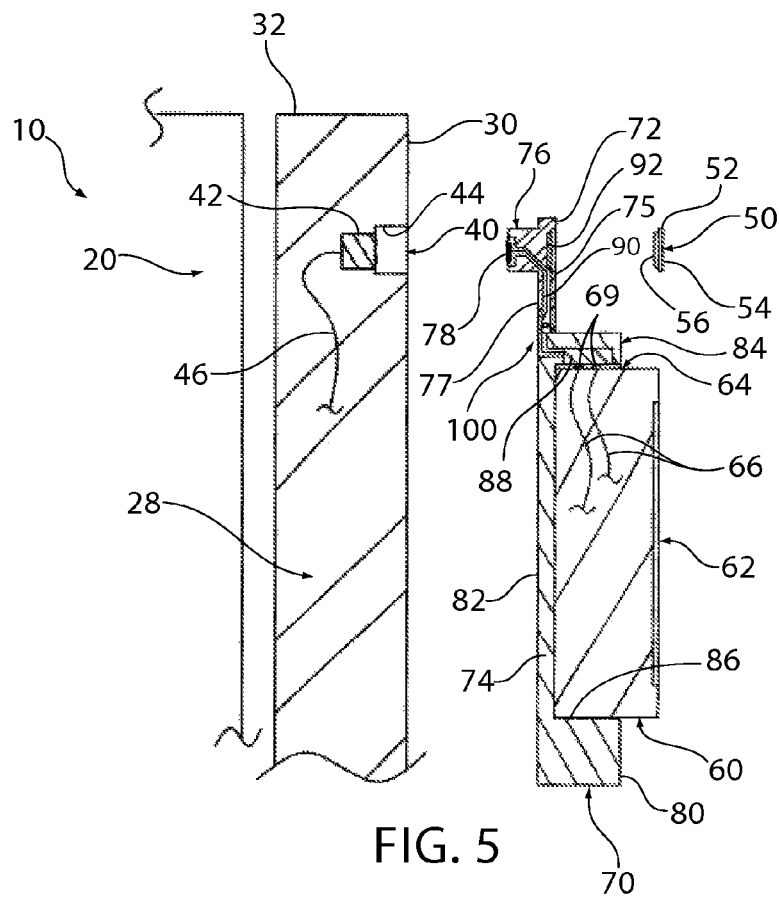
FIG. 5 is a sectional view through the components of FIG. 4 but with the functional device coupled to the adapter.

Referring to FIGS. 4-5, host electromagnetic service interface 40 includes a host coupler 42 incorporating the electromagnetic service coupling feature. The host coupler 42 may be disposed in a recess 44 in the vertical front face 30 of the door 28 of the host 20, or in a component of the host surface interface 40. The electromagnetic service is communicated to the host coupler 42 by way of at least one line 46 extending from the host coupler 42 to a supplier or consumer system (not shown) within or external to the host 20 that provides or uses the electromagnetic service.

For the host electromagnetic service interface 40 illustrated, the sole service being communicated is an electromagnetic service, such as power or data, the line(s) 46 may be a plurality of electrical wired or wireless pathways, and the source or consumer system may be a battery, a power transformer, a microprocessor, an electrically powered device, etc. Alternatively, for example, if an additional service such as a mechanical power source is provided, the line(s) 46 may be a mechanical power delivery system, such as a gear system, a shaft system, or a cable system, and the source of mechanical power may be a motor, a generator, or a fan (not illustrated). If the additional service is a substance communication service, the line(s) 46 may be a tube, and the source or consumer system may be a pump, a reservoir, or a dispenser (not shown). If the additional service is a heat communication service, the line(s) 46 may be a coolant line, and the source or consumer system may be a portion of a refrigeration system such as a compressor or an evaporator (not shown).

The host coupler 42 may comprise a socket or receptacle configured to accept a complementary plug associated with the adapter 70 that directly mates with the host coupler 42. Alternatively, the host coupler 42 can comprise a contact point between the host electromagnetic service interface 40 and the adapter 70 that are aligned by other features of the host electromagnetic service interface 40 and the adapter 70. It will be appreciated that the host coupler 42 may be chosen based on the particular host electromagnetic service interface 40 being used and can incorporates any necessary seals, shields, shut offs and other features as are required for the type of electromagnetic service being communicated by the host electromagnetic service interface 40.

The mechanical support service provided to the adapter 70 may also be at least partially communicated by the host coupler 42. For example, if the host coupler 42 is a mating socket and plug system, some mechanical support may be provided by the mechanical cooperation between the socket and the plug. The mechanical support service to the adapter 70 may also or alternatively be at least partially communicated by using one or more mounting screws 48a, 48b disposed on either side of the coupler 42. The host electromagnetic service interface 40 can also include corresponding holes 49a, 49b configured to align with the holes 49c, 49d, respectively, in the adapter 70 so as to receive a portion of the mounting screws 48a, 48b, respectively, so as the mount the adapter 70 to the host 20. The mechanical support service may alternatively be communicated by providing one or more anchor receivers accepting anchors (not shown) extending from the adapter 70 which is to be coupled to the host electromagnetic service interface 40.

The host coupler 42 of the host electromagnetic service interface 40 may be standardized so that it may be used by multiple adapters 70 for coupling different types of functional devices 60 to a variety of hosts 20.

Different categories of host electromagnetic service interfaces 40 may provide more than one electromagnetic service, or an additional non-electromagnetic service, such as mechanical power or delivery of a substance, or may even have more than one host coupler 42. Adapter 70 may not take advantage of all of the services or couplers available from the host electromagnetic service interface 40, but may communicate at least the mechanical support service and at least one electromagnetic service with the host electromagnetic service interface 40. For example, a host electromagnetic service interface 40 may be capable of communicating power, computer data, and an analog video signal. A first adapter 70 for use with this host electromagnetic service interface 40 may communicate only one or two of these services while a different adapter 70 may communicate a different one or two of these services as well as a non-electromagnetic service.

One or more electromagnetic service communicating devices can be connected directly or indirectly for coupling to the host electromagnetic service interface 40. In the system illustrated in FIGS. 4-5, the service communicating devices include adapter 70 coupled directly to the host electromagnetic service interface 40 and functional device 60 coupled indirectly to host 20 via the adapter 70. Functional device 60 can be configured for being removably coupled to host 20 via the adapter 70.

Functional device 60 can be a device that performs a primary function independent of the host 20. In the drawings, the functional device 60 is an accessory device for which the primary function is entertainment, education, communication or data function. Examples of such accessory devices are given above. Alternatively, the functional device 60 may perform some mechanical action. Examples of such devices include fans, dispensers, heaters, and can openers.

Functional device 60 includes a functional component 62 that is associated with the functionality of the functional device 60. The functional component 62 uses or provides at least one electromagnetic service. Examples of functional components 62 include a video display, user interface, microprocessor, dispenser, a speaker, knobs or buttons, a data display, a keypad, a printer, a microphone, a camera or a power system. The functional component 62 may provide a user interface to enable the user to interact with the functional device 60 or receive a functional output from the functional device 60.

Functional device 60 further includes a device electromagnetic service interface 64 connected by at least one line 66 to the functional component 62 to permit communication of the mechanical support service and the electromagnetic service to other devices, such as adapter 70. When coupled to the host 20, functional device 60 may communicate a variety of services through device interface 64. The device electromagnetic service interface 64 may include a mechanical system, such as a gripping or interlocking system (not shown) for mechanically coupling the functional device 60 to the adapter 70. Alternatively, the device electromagnetic service interface 64 may communicate the mechanical support service by having external features, such as peripheral surface 68, that are configured to accommodate the adapter 70. The device electromagnetic service interface 64 may include electrical contacts 69 for electrically coupling the functional device 60 with the adapter 70. The device electromagnetic service interface 64 may also include a second coupler (not shown) for communicating an additional service. The second coupler may include mechanical coupling features for mechanically coupling the functional device 60 to the adapter 70.

With continued reference to FIGS. 4-5, adapter 70 is configured to removably couple with host electromagnetic service interface 40 to receive at least one mechanical support service and at least one electromagnetic service from the host electromagnetic service interface 40. Adapter 70 is provided because it may be desirable to couple the functional device 60 to the host 20 even when they are not configured to be directly coupled with each other; for example, when the host electromagnetic service interface 40 is not compatible with the device electromagnetic service interface 64. The functional device 60 and host 20 are therefore indirectly coupled via the adapter 70.

Figure 8:
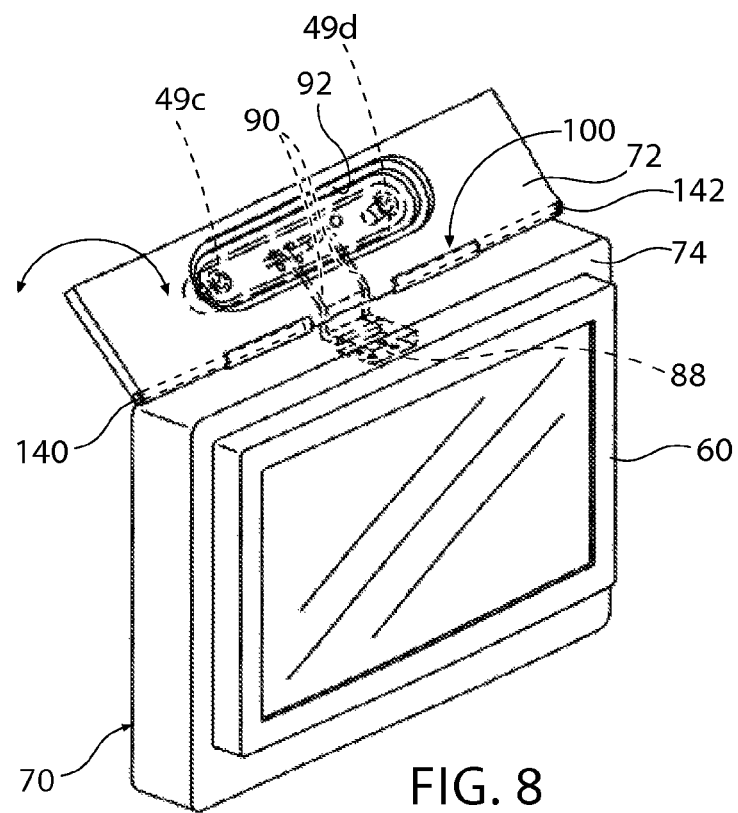
FIG. 8 is a further enlarged perspective view of the adapter of FIGS. 1-7 illustrating additional details.

Referring to FIGS. 5 and 8, the adapter 70 comprises upper and lower members 72 and 74 pivotally connected together by a hinge system 100, described later in detail. Upper member 72 can be generally rectangular in shape and can comprise a front side 75, a backside 77, and a first adapter electromagnetic service interface 76 extending from the backside 77 and capable of coupling with the host electromagnetic service interface 40. The first adapter electromagnetic service interface 76 may include a first adapter coupler 78 insertable into the recess 44 to couple with the host coupler 42. For example, if the host coupler 42 is a socket, the first adapter coupler 78 may be a plug capable of coupling with the socket. Alternatively, the first adapter coupler 78 and the host coupler 42 may be provided with contacts that have no mechanical engagement function and the couplers 42, 78 are held in an aligned and coupled condition by cooperating mechanical coupling systems of the host electromagnetic service interface 40 and the first adapter interface 76, such as the screws 48*a*, 48*b* and holes 49*a-d* described previously herein for FIG. 4.

Lower member 74 can comprise a front side 80 and a backside 82, and is configured to receive at least a portion of the functional device 60 to provide the mechanical support service to the functional device 60. Lower member 74 also provides an electromagnetic service to the functional device 60. Accordingly, lower member 74 is provided with a second adapter electromagnetic service interface 84 on the front side 80 capable of coupling with the device electromagnetic service interface 64. In the adapter 70 illustrated in the drawings, the second adapter interface 84 includes a recess 86 formed in the front side 80 for accepting a portion of the functional device 60 and coupling with features of the peripheral surface 68 of the functional device 60 to hold the functional device 60 to the adapter 70. The second adapter interface 84 further includes a second adapter coupler 88 capable of coupling with the device electromagnetic service interface 64 for communicating the electromagnetic service between the functional device 60 and the adapter 70.

The adapter 70 further includes at least one line 90 connecting the first adapter coupler 78 to the second adapter coupler 88. As illustrated in FIG. 8, two lines 90 connect the first and second adapter couplers 78, 88. The lines 90 form at least a portion of a service pathway extending between the members 72, 74. The service pathway may be considered to extend between the host 20 and functional device 60 via the adapter 70. If the lines are physical lines, the lines 90 can extend around or through the hinge system 100 in a manner described later. Lines 90 may be data or power wires or may be a wireless communication pathway between respective wireless communication components (not shown) in the first and second adapter couplers 78, 88.

It will further be appreciated that, while the adapter 70 depicted herein is provided with wired couplers, it will be appreciated that some or all of the couplers may include wireless transmitters or receivers, and some or all of the lines 46, 66, 90 may be representative of the wireless communication between couplers. It will further be appreciated that if the electromagnetic service is being provided wirelessly by the host electromagnetic service interface 40, it may be communicated to a wireless coupler in upper member 72 or lower member 74. Similarly, the electromagnetic service provided to the functional device 60 may be a provided wirelessly by a coupler in either member 72, 74. Alternatively, the electromagnetic service may be communicated wirelessly between the first adapter coupler 78 and the second adapter coupler 88. Some of these alternatives may remove the need to route lines between the members 72, 74.

The adapter 70 may have added functionality such as a user interface (not shown) that may be used to communicate with the host 20 or the functional device 60, or a charging system (not shown) for storing power received from the host 20 or the functional device 60 and for later providing the stored power to the host 20 or the functional device 60. In implementations where the adapter 70 has additional functionality, the adapter 70 may communicate some services with just the host electromagnetic service interface 40 or just the functional device 60 without communicating the service between the host electromagnetic service interface 40 and the functional device 60.

In another example of added functionality, the adapter 70 may transform the electromagnetic service received from the host electromagnetic service interface 40 or the device interface 64 before providing the transformed service to the other interface. For example, the adapter 70 may transform AC into DC current or change the voltage level. Data communication may be transformed such that the adapter 70 changes unencrypted data to encrypted data or a standard communication protocol to a proprietary protocol. Other anticipated transformations include the changing from wired power to wireless power, from wired data to wireless data, or from standard power or standard data to power with imbedded data. The adapter 70 may effect communication between two physical layers of a data system. Examples of software layer protocol are Zigbee and Bluetooth. The adapter 70 may be used to transform either of the Zigbee and Bluetooth data packets into the other of the Zigbee and Bluetooth data packets to effect communication between devices using a different protocol.

The adapter 70 may further have an added functionality unrelated to the supplying of electromagnetic service between the host 20 and functional device 60. The adapter functionality may operate independently of the host 20 or the functional device 60, or it may enhance one or more of the functions of the host 20 or the functional device 60. The functionality may be dependent upon whether the adapter 70 is coupled with the host 20, and also on whether the functional device 60 is coupled with the adapter 70. The functionality may permit the adapter 70 and/or the functional device 60 to be used independently of the host 20. Examples of adapter functionality unrelated to electromagnetic service supply include, but are not limited to, a speaker, a user interface, a display projection, a media manager, a whiteboard, physical storage, application software hosting, communications routing, power storage, microphone, data storage, and accessory device. An adapter 70 with speaker functionality comprises at least one audio speaker that intensifies and makes speech or music audible. An adapter 70 with user interface functionality comprises a display and/or an input area that allows the user to interface with the host 20, adapter 70, functional device 60, or an external source. An adapter 70 with calendar projection functionality allows a calendar or schedule to be projected visually or audibly. An adapter 70 with media manager functionality allows a user to manage all types of media (e.g. music, video, pictures, etc.). An adapter 70 with whiteboard functionality comprises a conventional whiteboard for temporarily writing messages, and may be available to the user only when a functional device 60 is not coupled to the adapter 70, or may be available at all times to the user. An adapter 70 with physical storage functionality comprises a storage compartment for storing items, and may be particularity useful for storing companion items for the functional devices, such as a remote control for a functional device comprising a television or DVDs for a consumer electronic device comprising a DVD player. An adapter 70 with power storage functionality comprises a source of stored power, such as a rechargeable battery. An adapter 70 with data storage functionality comprises means for storing data, such as a hard drive. An adapter with accessory device functionality incorporates the entire functionality of one or more accessory devices as a function of the adapter.

Figure 6:
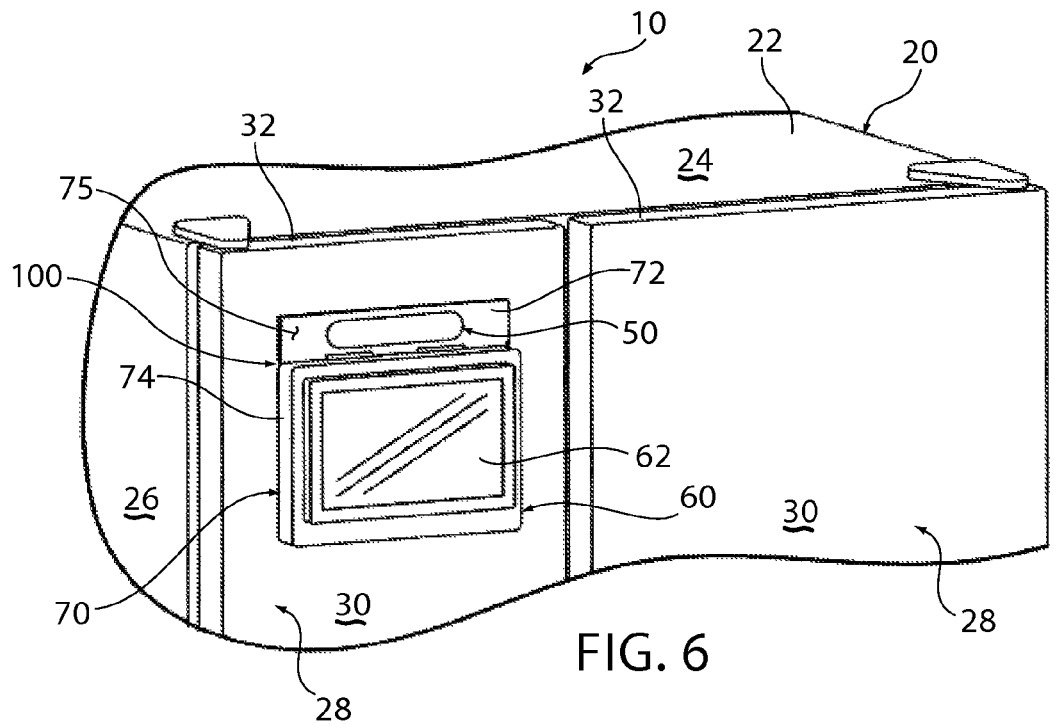
FIG. 6 is an enlarged view of a portion of FIG. 1 showing in an assembled illustration the adapter coupled to the interface on the door and the functional device and the interface cover coupled to the adapter.
Figure 7:
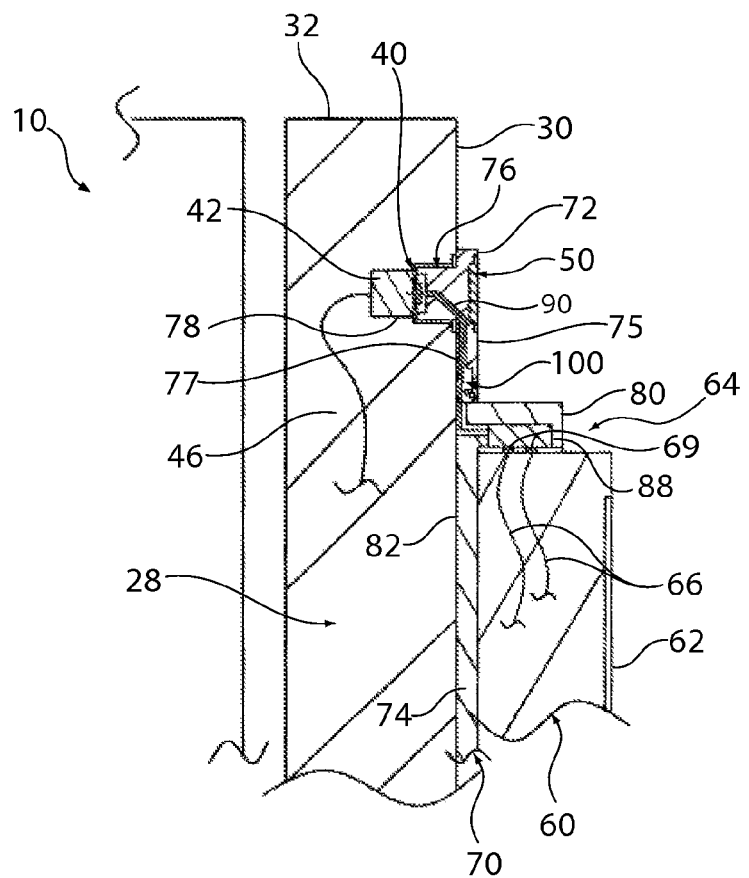
FIG. 7 is a sectional view through the components of FIG. 6.

Referring to FIGS. 4-6, modular system 10 further includes a detachable interface cover 50. The detachable interface cover 50 provides the host 20 with a finished appearance by covering any unused components of the host electromagnetic service interface 40, such as the host coupler 42, and further protects the host electromagnetic service interface 40 unintentional access or damage when not in use. The interface cover 50 is provided with a face portion 52 having an ornamental surface 54 and mounting system such as a mounting projection 56 insertable into the recess 44 of the host electromagnetic service interface 40. Other mounting system may be used to attach the interface cover 50 to the host 20. The interface cover 50 may fill an aesthetic function, by being made to conform to the color and contour of the host 20, such as by matching the finish of the door 28, its handles 35, or the ice and water dispenser 34 of host 20. Alternatively, the interface cover 50 may contrast with the finish of host 20.

To prevent the interface cover 50 from being misplaced or lost when the adapter 70 and functional device 60 are coupled to the host electromagnetic service interface 40, the interface cover 50 may alternatively attached to the adapter 70 when the adapter is attached to the host electromagnetic service interface 40. For example, a recess 92 may be provided on the front side 75 of the upper member 72 of the adapter 70, as shown in FIG. 4, and can be configured to be selectively closed by the interface cover 50 to protect or hide the screws 48a, 48b and/or other features of the adapter 70 that would otherwise be exposed. Alternatively, the interface cover 50 may be used to cover an additional host electromagnetic service interface (not shown) provided on the adapter 70 for the sequential or ganged mounting of additional adapters.

Adapter 70 may be designed so as to be generally flush with a surface of the host 20. Thus, when used with a host 20 having a host electromagnetic service interface 40 extending inwardly from a vertical surface, as illustrated in FIGS. 1-7, the adapter 70 may be configured such that both the upper and lower members 72, 74 are disposed vertically and flush with the vertical surface, such as the vertical front face 30. Similarly, both members 72, 74 of the adapter 70 may be mounted flush with a horizontal surface or the members may configured to be oriented at other relative angles, as required by the nature of the host. It follows that members 72 and 74 may be rotated relative to one another via hinge system 100 so as to be oriented at any angle relative to one another, as required for mounting the adapter 70 to a particular host in a desirable manner. It may further be desirable to releasably lock members 72 and 74 of adapter 70 into one or more of these relative orientations to prevent undesirable movement or swinging of either member 72, 74 of the adapter 70, particularly if the adapter 70 is to be mounted to a moving host, such as a vehicle, or to a moving component of a host, such as door 28. Such a lock can be incorporated into the hinge system 100, as will be described in more detail hereinafter.

Figure 15:
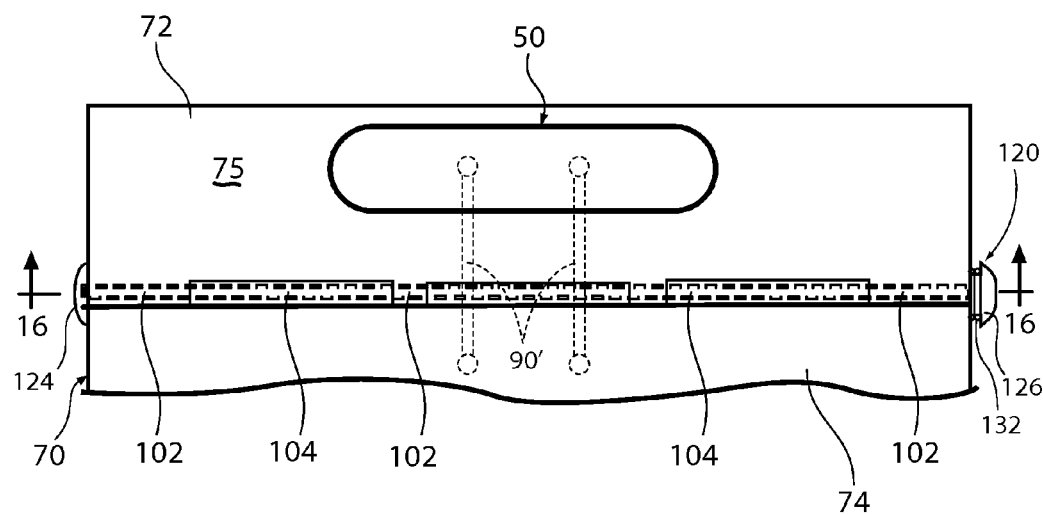
FIG. 15 is a top plan view of the adapter of FIG. 1 illustrating a hinge system for the adapter having a hinge pin and a hinge locking system.
Figure 16:
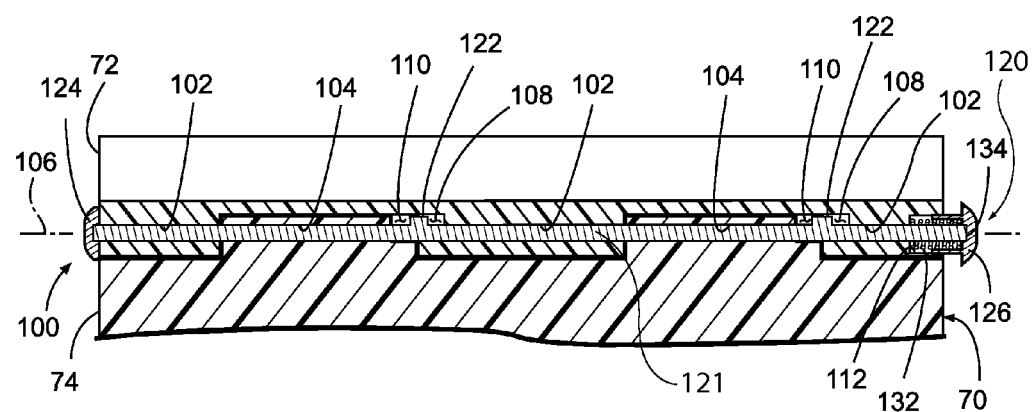
FIG. 16 is a sectional view taken along line 16-16 of FIG. 15 illustrating the hinge locking system in a locked position.
Figure 17:
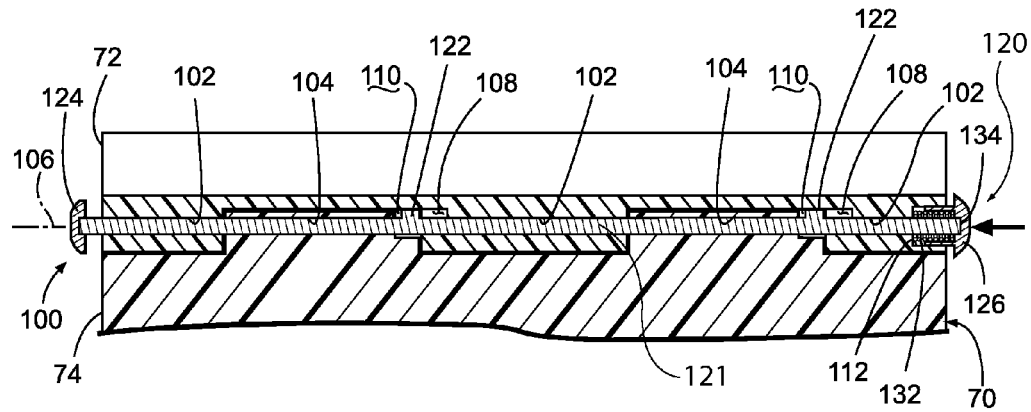
FIG. 17 is a sectional view similar to FIG. 16 illustrating the hinge locking system in an unlocked position.

Referring to FIGS. 15-17 the hinge system 100 between the members 72, 74 of the adapter 70 includes two or more aligned passageways 102 and 104 formed within member 72 and 74, respectively. The passageways 102, 104 are illustrated as generally cylindrical in shape but can alternatively have any shape suitable for the purposes described herein. Passageways 102 and 104 together define a pivot axis 106 of hinge system 100 about which the member 72 and member 74 can pivot relative to one another. As illustrated, the hinge system 100 comprises three passageways 102 in member 72 and two passageways 104 in member 74. The passageways 102, 104 are configured for coaxial alignment when the members 72, 74 are mounted to one another by the hinge assembly 100. One of the passageways 102 is provided with at least one keying feature, such as keyways 108, at a position adjacent one of the passageways 104, which is provided with a corresponding keying feature(s), such as keyways 110. At least one of the passageways 102, 104 is provided with an enlarged portion or counter bore, such as counter bore 112 in one of the passageways 102.

A hinge pin 120 comprises an elongated body 121 having at least one key 122 configured for selective engagement with one or both of the keyways 108 110. The hinge pin 120 is disposed substantially within passageways 102 and 104. The key 122 and the keyways 108 and 110 form a releasable lock for selectively interlocking the hinge pin 120 and the members 72 and 74 in one or more predetermined positions or relative orientations, as described previously herein.

A head 124 is provided on one end of the hinge pin 120. The other end of the hinge pin 120 is attached to an end cap 126 that is reciprocally disposed in the counter bore 112. The end cap 126 includes a coil spring 132. The hinge pin 120 passes through the passageways 102 and 104, the counter bore 112, and the coil spring 132, and is attached to the end cap 126, for example, by engaging an end of the hinge pin with an aperture 134 in the end cap 126.

In operation, the coil spring 132 biases the hinge pin 120 into a locked position shown in FIG. 16, wherein the key 122 is engaged in both keyways 108 and 110 such as to prevent rotation of the members 72 and 74 relative to one another. Upper member 72 may be pivoted relative to lower member 74 by disengaging the key 122 from the keyway 108. This is accomplished by depressing end cap 126, which slides hinge pin 120 axially within passageways 102 and 104 and disengages key 122 from keyway 108, as shown in FIG. 17. This action slides key 122 into keyway 110. Upon releasing end cap 126, hinge pin 120 is urged back to its locked position (wherein key 122 leaves keyway 110 and engages keyway 108) by coil spring 132, as shown in FIG. 16. The keyways 108, 110 can be configured so as to lock the members 72, 74 into one or more specific orientations as desired.

Hinge system 100 may alternately use multiple separate pins to join the members 72, 74. Alternatively, a locking system independent of the hinge system 100 may releasably secure the member 72 in either or both of the horizontal and vertical orientations relative to the member 74.

The hinge system 100 can be configured to permit the lines 90 to pass between the members 72, 74 without interruption. Further, the lines 90 can be configured to permit the communication of electromagnetic service regardless of the orientation of the members 72, 74, or dependent on the orientation of the members 72, 74. The electromagnetic service lines 90 may be routed around or through the hinge pin 120. This provides a simple structure for the hinge system 100, particularly if service lines 90 provide wireless electromagnetic communication between the members 72, 74. It will be appreciated that the lines 90 may be routed between the members 72, 74 through a reinforced or fortified section adjacent hinge system 100 to prevent or reduce wear of the lines 90 caused by movement of the hinge system 100. Alternatively, the lines 90 may be routed from upper member 72 to the hinge assembly system 100, then axially though the hinge system 100 to lower member 74.

Figure 9:
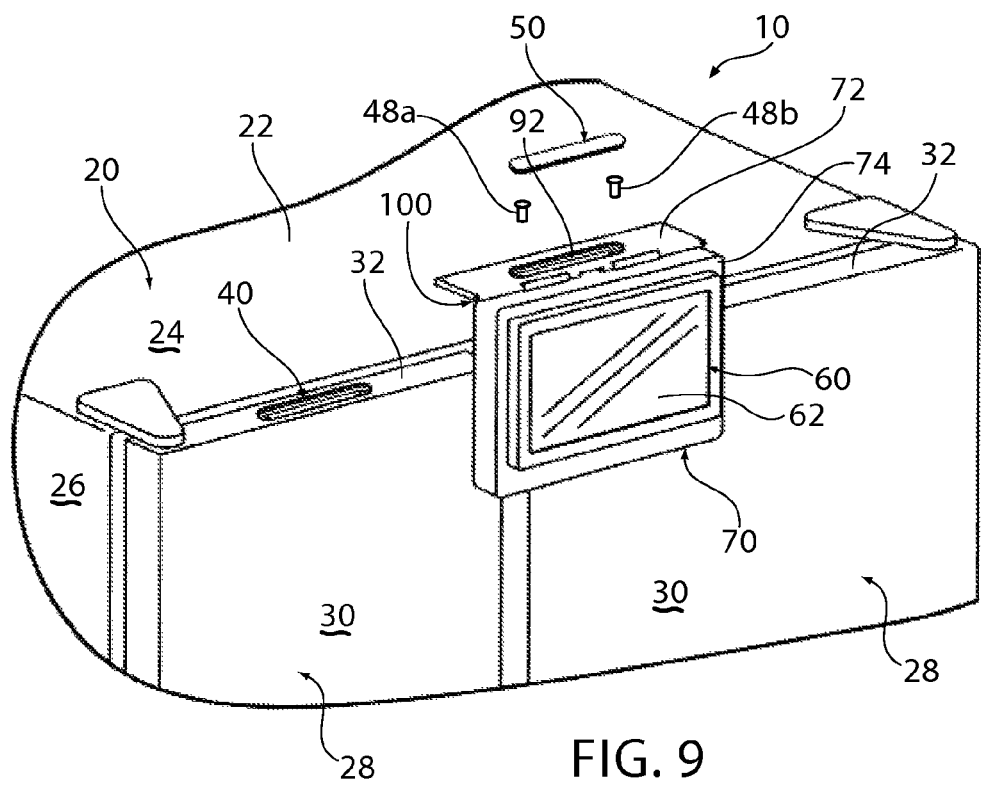
FIG. 9 is an exploded perspective view of a second embodiment of a modular system comprising a refrigerator having a host interface in an alternative configuration, a functional device, an interface cover, and an adapter in an alternative orientation for coupling with the alternative host interface.
Figure 10:
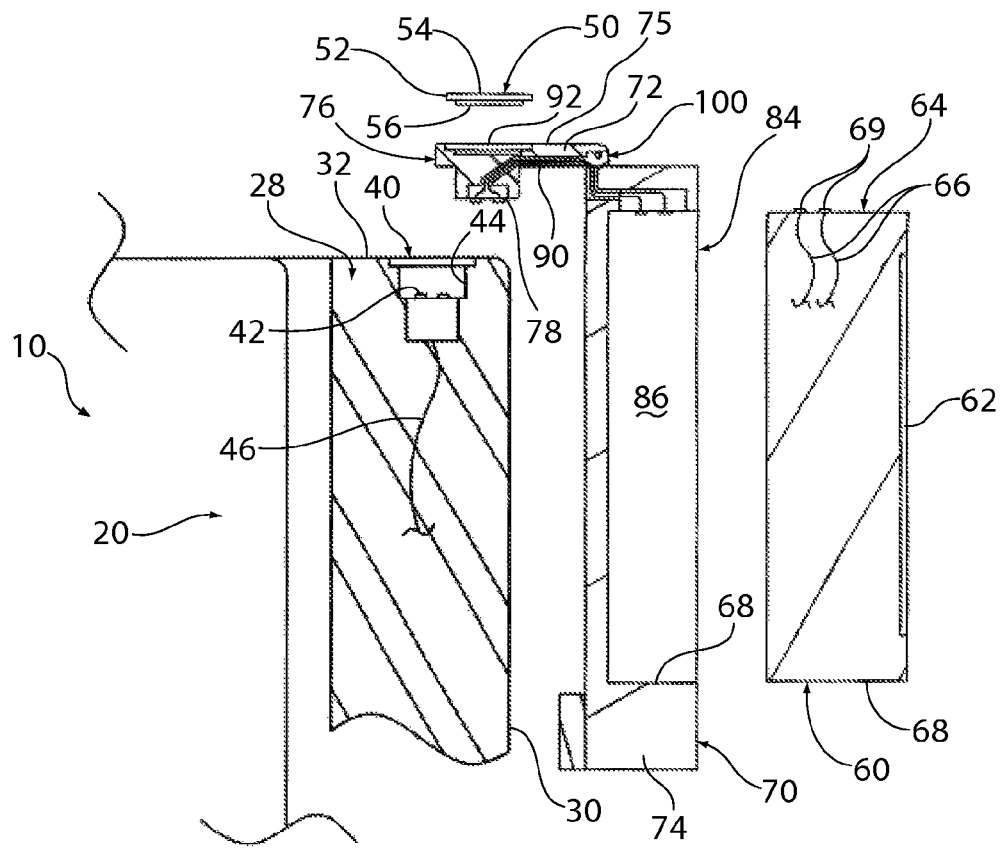
FIG. 10 is a sectional view through the components of FIG. 9.
Figure 11:
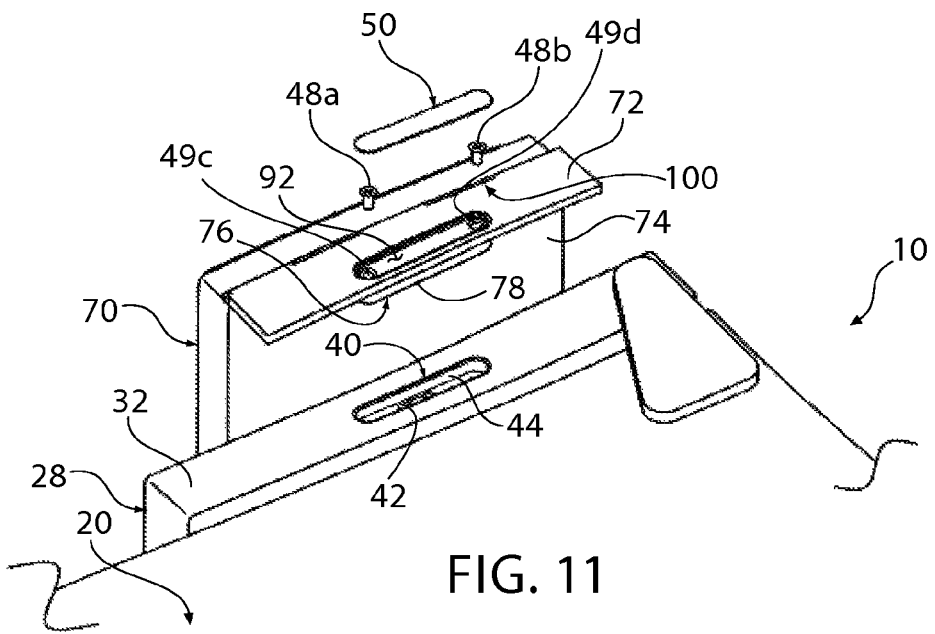
FIG. 11 is an exploded rear perspective view of the components of FIG. 9.
Figure 18:
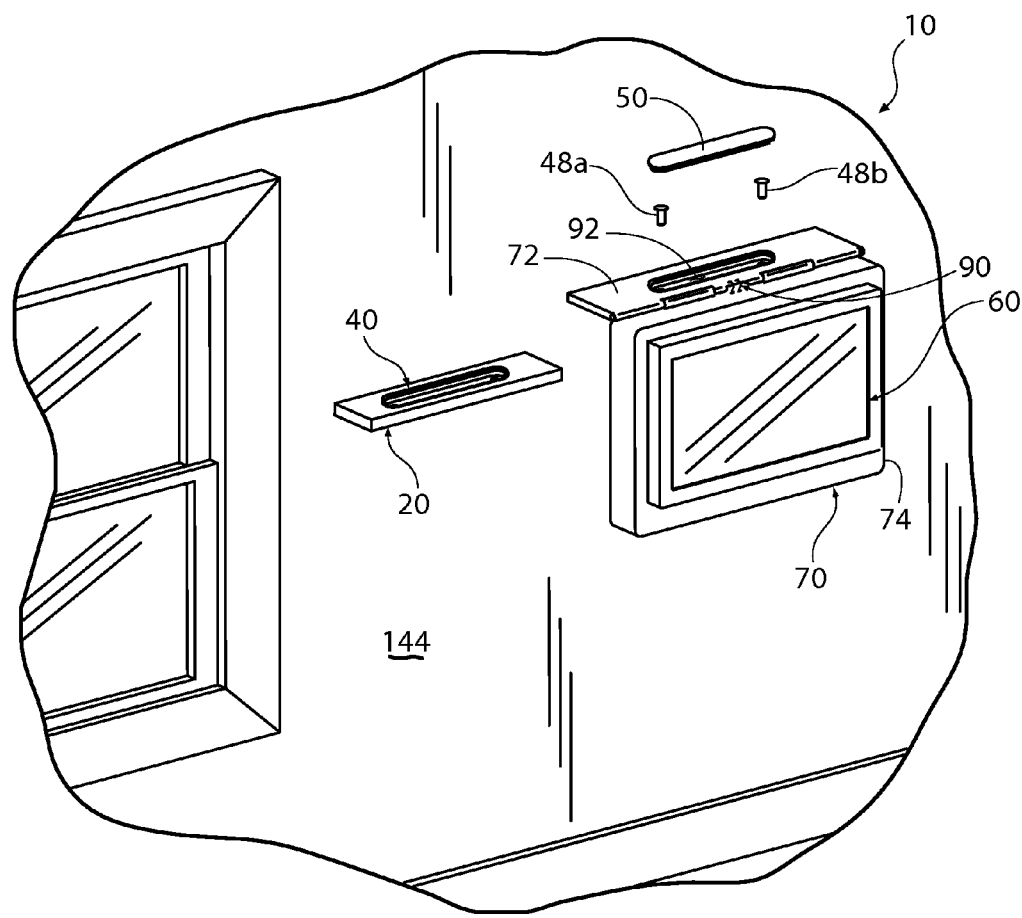
FIG. 18 is a schematic exploded perspective view of a third embodiment of a modular system comprising a wall-mounted host, an adapter, a functional device and an interface cover.

Hinge system 100 permits relative movement of the members 72, 74 to place them in different orientations having different angular relationships between the members 72, 74. For example, in one angular relationship, the members 72, 74 are generally oriented along a common plane, such as can be seen in FIG. 6. In another angular relationship, the members 72, 74 are generally oriented along perpendicular planes, such as can be seen in FIGS. 9 and 18. The two angular relationships are approximately 90° apart from the other. Angular relationship between the members 72, 74 other than those illustrated herein are also possible.

Referring to FIGS. 9-14, a second embodiment of a modular system 10 according to the invention is illustrated. The second embodiment modular system 10 is similar in some respects to the first embodiment, and like elements will be identified using the same reference numerals. For the second embodiment, the host electromagnetic service interface 40 has a different orientation, but is otherwise substantially similar to the host electromagnetic service interface 40 shown in FIGS. 1-7. The host electromagnetic service interface 40 is illustrated on a horizontal top edge 32 of one of the doors 28. The host electromagnetic service interface 40 can be considered to be "upwardly-oriented" since the recess 44 is open in an upward direction. The adapter 70 may be configured such that upper member 72 is flush with the horizontal top edge 32 of host 20 while the lower member 74 is flush with the vertical front face 30 of the host 20. In this position, the adapter 70 is still carried by the door 28. The hinge system 100 permits the members 72, 74 to rotate relative to each other as required for coupling with host electromagnetic service interface 40. As illustrated, the upper and lower members 72, 74 are orientated at approximately 90° to each other.

Figure 12:
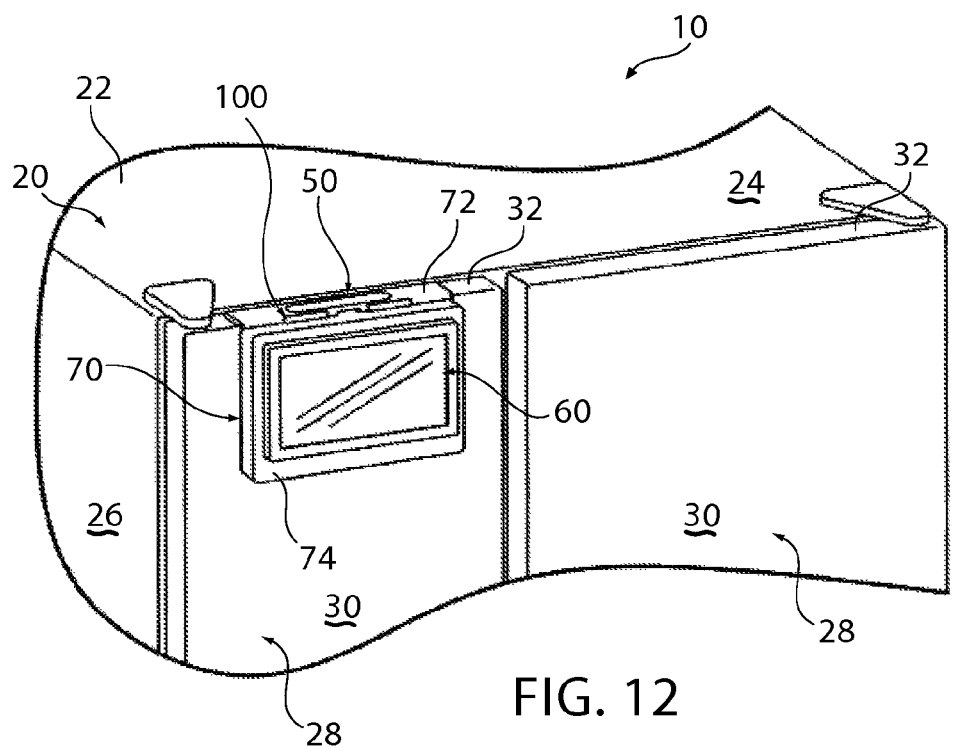
FIG. 12 is a perspective view of the components of FIG. 9 in an assembled condition.
Figure 13:
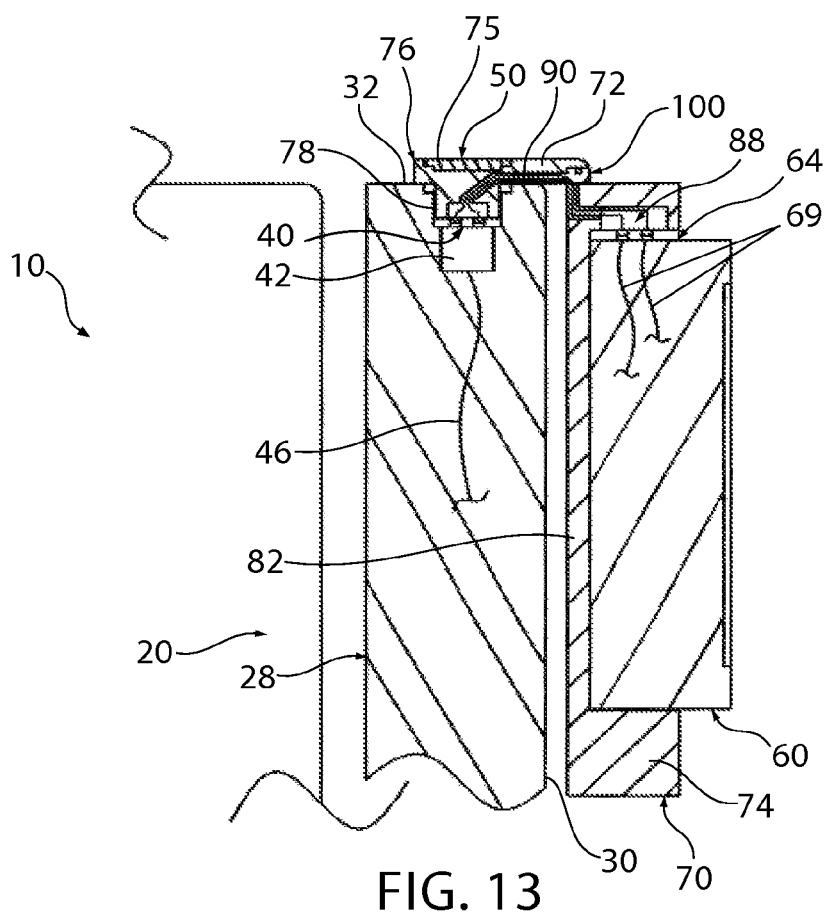
FIG. 13 is a sectional view through the components of FIG. 12.
Figure 14:
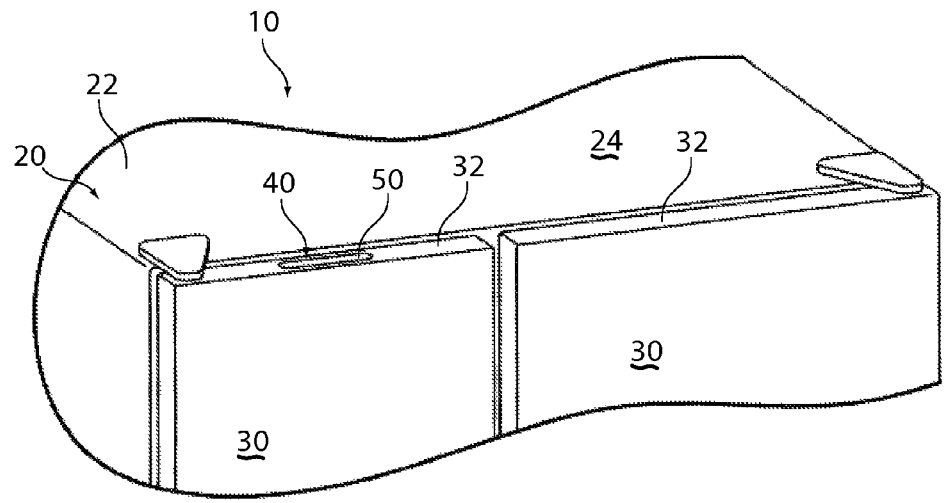
FIG. 14 is a perspective view of the refrigerator and the interface cover of FIG. 9 in an assembled condition without the adapter or the functional device.

Referring to FIGS. 12 and 14, the interface cover 50 can alternately be mounted to the adapter 70 to cover the recess 92, as shown in FIG. 12, or to the host 20 when the adapter 70 is not present, as shown in FIG. 14.

Referring to FIG. 8, the adapter 70 of the second embodiment comprises a modified hinge system 100. The hinge system 100 of the second embodiment is substantially similar to the hinge system described for FIGS. 15-17, except that the illustrated hinge system 100 uses two pins 140 and 142 each passing through passageways formed in the members 72, 74. A gap between the pins 140 and 142 is provided for lines 90 to be routed between the members 72 and 74 across the pivot axis of the hinge system 100. At least one and optionally both of the pins 140 and 142 can be provided with keying features for use with a corresponding keyway feature as described above. Electromagnetic service lines 90 may be routed in a manner to such as to be hidden from a user, as shown in FIG. 8, or may be visible. Alternatively, (not shown) electromagnetic service lines 90 may include an intermediate portion extending in axial alignment with hinge pins 140 and 142 so as to take up a portion of the stress along the wire from the relative rotation of members 72 and 74. In this example, the electromagnetic service lines 90 may be directed along an axial bore in one of pins 140 or 142 or disposed between the pins 140, 142.

Figure 19:
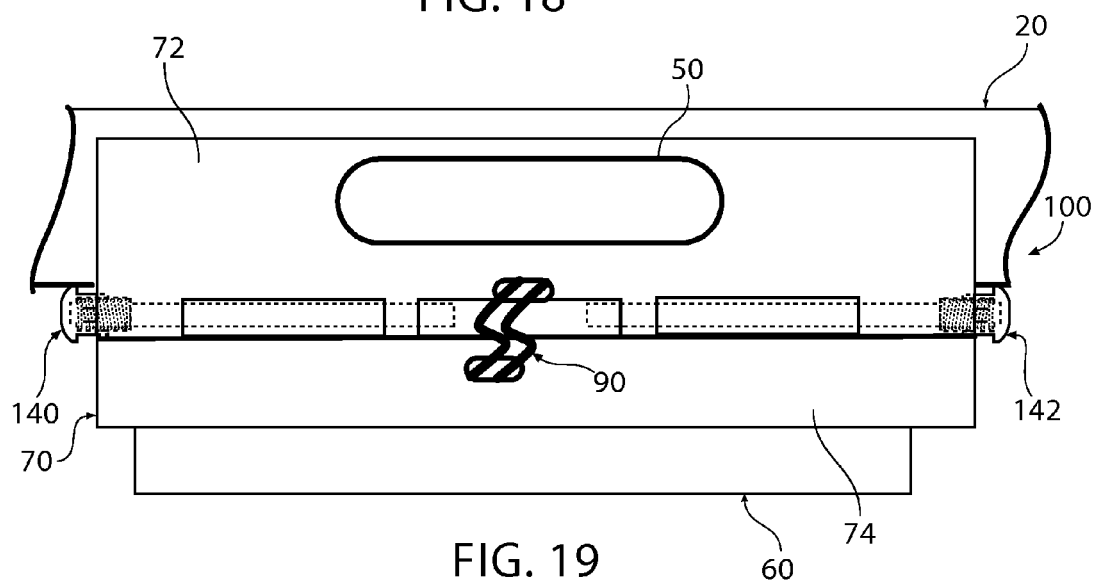
FIG. 19 is a top plan view of the adapter of FIG. 18, illustrating an alternative hinge system and wire routing for the adapter.

Referring to FIGS. 18-19, a third embodiment of a modular system 10 according to the invention is illustrated. The third embodiment modular system 10 is similar in some respects to the first and second embodiments, and like elements will be identified using the same reference numerals. As described above, the host electromagnetic service interface 40 may be associated with a host 20 other than an appliance. For the third embodiment of the modular system 10, the host 20 may be mounted to a wall 144. While illustrated schematically as projecting from wall 144 and providing an upwardly oriented host electromagnetic service interface 40, the host electromagnetic service interface 40 of the host 20 may be oriented in any desired direction. Wall host 20 may be integrated with the wall 144 to provide a flush mounting with the wall 144 or may be a modular unit that may be removably mounted to the wall 144. The wall host 20 may have its own internal supplier or consumer of the electromagnetic service or may receive the electromagnetic service from the environment by being coupled to a source of service, such as a wall power outlet, Ethernet jack, or cable jack. Mechanical connectors, such as screws 48a, 48b, may be used to couple the adapter 70 to the wall host 40.

Referring to FIG. 19, the adapter 70 of the second embodiment comprises a modified hinge system 100. The hinge system 100 of the second embodiment is substantially similar to the hinge system 100 described for FIG. 8, except that the illustrated hinge system 100 routes electromagnetic service lines 90 between the members 72, 74 in a manner such as to be visible to a user.

Although each of the modular systems 10 is described as having a single host, a single host electromagnetic service interface, a single adapter, and a single functional device, various additional combinations of these components can also be considered to be modular systems. As non-limiting examples, an adapter plus any two similar host electromagnetic service interfaces as well as an adapter plus two dissimilar hosts each with a host electromagnetic service interface can also be considered modular systems when the adapter may be alternatively coupled to either of the host electromagnetic service interfaces.

With regard to the processes, systems, methods, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

It is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In summary, it should be understood that the invention is capable of modification and variation and is limited only by the following claims.

All terms used in the claims are intended to be given their broadest reasonable constructions and their ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. An electromagnetic service communicating device for mounting to a host having a horizontal surface with an upwardly oriented host electromagnetic service interface providing at least one electromagnetic service, the electromagnetic service communicating device comprising:
    a first member comprising a functional device and having a first edge;
    a second member having a second edge and a second electromagnetic service interface capable of removably coupling with the host electromagnetic service interface and communicating the at least one electromagnetic service with the host electromagnetic service interface;
    a service pathway operably coupling the second electromagnetic service interface with the functional device for the communication of an electromagnetic service therebetween; and
    a hinge pivotally connecting the second member to the first member at the first and second edges;
    wherein the second member pivots relative to the first member between a first orientation in which the first and second members are generally oriented along a common plane, and a second orientation in which the first and second members are generally oriented along perpendicular planes.

2. The electromagnetic service communicating device according to claim 1, and further comprising at least one releasable lock capable of securing the second member in a predetermined position relative to the first member.

3. The electromagnetic service communicating device according to claim 1 wherein the service pathway is configured to communicate at least one service between the first and second member in both the first and second orientation.

4. The electromagnetic service communicating device according to claim 1 wherein the host and second electromagnetic service interfaces face opposing directions in the first orientation.

5. The electromagnetic service communicating device according to claim 1 wherein the electromagnetic service comprises at least one of power and data.

6. An adapter for mounting a functional device to a host having a horizontal surface with an upwardly oriented host electromagnetic service interface providing at least one electromagnetic service, the adapter comprising:
    a first member capable of supporting a functional device and having a first edge;
    a second member having a second edge and an electromagnetic service interface capable of removably coupling with the host electromagnetic service interface and receiving the at least one electromagnetic service from the host electromagnetic service interface;
    a hinge pivotally connecting the second member to the first member at the first and second edges for movement between a first orientation in which the first and second members are generally oriented along a common plane, and a second orientation in which the first and second members are generally oriented along perpendicular planes; and
    a service pathway configured to communicate the at least one electromagnetic service between the first and second members in both the first and second orientation of the second member.

7. The adapter according to claim 6 wherein the first member has a device electromagnetic service interface capable of removably coupling with the functional device.

8. The adapter according to claim 7 wherein the functional device is one of an accessory device, a portable device, an independent device, and a dependent device.

9. The adapter according to claim 7 wherein the device electromagnetic service interface provides at least one service to the functional device.

10. The adapter according to claim 9 wherein the at least one service is the at least one electromagnetic service received by the host electromagnetic service interface.

11. The adapter according to claim 9 wherein the at least one service further comprises at least one of mechanical power, electrical power, data, thermal energy, illumination, and substance.

12. The adapter according to claim 6, and further comprising at least one releasable lock capable of securing the second member in at least one of the first orientation and the second orientation.

13. The adapter according to claim 6 wherein the host electromagnetic service interfaces and the electromagnetic service interface of the second member face opposing directions when the second member is in the first orientation.

14. The adapter according to claim 6, wherein the adapter is configured to communicate at least one service between the first and second members in both the first and second orientations.

15. The adapter according to claim 6 wherein the at least one electromagnetic service comprises at least one of power and data.

16. An electromagnetic communicating device for mounting a functional device to a host electromagnetic service interface capable of providing a mechanical support service and at least one electromagnetic service, the electromagnetic communicating device comprising:
    a first member having a first edge and a first electromagnetic service interface oriented in a first direction and capable of removably coupling with the host electromagnetic service interface and capable of receiving the mechanical support service and capable of communicating the at least a first electromagnetic service from the host electromagnetic service interface;
    a second member having a second edge and a device electromagnetic service interface capable of removably coupling with the functional device and capable of providing the functional device with mechanical support service and capable of communicating at least a second electromagnetic service with the functional device;
    a hinge system pivotally connecting the first member to the second member at the first and second edges to movably support the second member in a plurality of relative angular orientations, including at least a first orientation in which the first and second members are generally oriented along a common plane and a second orientation in which the first and second members are generally oriented along perpendicular planes; and
    a service pathway connecting the first and device electromagnetic service interfaces and capable of communicating at a third electromagnetic service therebetween.

17. The electromagnetic service communicating device according to claim 16 wherein the device electromagnetic service interface is oriented in a second direction different than the first direction.

18. The electromagnetic service communicating device according to claim 16, and further comprising a releasable lock system capable of releasably locking the first and second members in at least one of said plurality of relative angular orientations.

19. The electromagnetic service communicating device according to claim 18 wherein the releasable lock system is capable of releasably locking the first and second members in at least the first orientation and the second orientation, which are generally 90° each apart from each other.

20. The electromagnetic service communicating device according to claim 16 wherein the third service electromagnetic service comprises the first electromagnetic service.

21. The electromagnetic service communicating device according to claim 16 wherein the third service electromagnetic service comprises the second electromagnetic service.

22. The electromagnetic service communicating device according to claim 16, configured to communicate the third electromagnetic service between the first and second member in at least the first orientation and the second orientation.

23. A modular system for communicating an electromagnetic service, comprising:
    a host having a host electromagnetic service interface capable of providing a mechanical support service and communicating at least one electromagnetic service, the host electromagnetic service interface having one of a vertical orientation and a horizontal orientation; and
    a service communicating device removably coupled with the host and comprising:
        a first member having a device electromagnetic service interface capable of removably coupling with the host electromagnetic service interface to receive the mechanical service and communicate the at least one electromagnetic service; and
        a second member capable of supporting a functional device, the second member pivotally connected to the first member to move between at least a first position for connecting the device electromagnetic service interface to the host electromagnetic service interface having the vertical orientation, and a second position for connecting the device electromagnetic service interface to the host electromagnetic service interface having the horizontal orientation.

24. The modular system according to claim 23 wherein in the first position the first and second members are oriented along a common plane and in the second position the first and second members are oriented along perpendicular planes.

25. The modular system according to claim 23 wherein the device electromagnetic service interface is capable of providing a mechanical support service and an electromagnetic service to the functional device.

26. The modular system according to claim 23 wherein the at least one electromagnetic service comprises at least one of power and data.

27. The modular system according to claim 23, and further comprising at least one releasable lock capable of securing the second member in at least one of the first and second positions.

28. The modular system according to claim 23 wherein the host comprises an appliance.

29. The modular system according to claim 23, and further comprising a removable cover capable of connecting to at least one of the host and the service communicating device to cover the host electromagnetic service interface and the device electromagnetic service interface, respectively.

30. The modular system according to claim 23 wherein the service communicating device provides at least one service different from the at least one electromagnetic service provided by the host.

31. The modular system according to claim 23 wherein the host further comprises a standardized electromagnetic service interface providing the mechanical support service and the at least one electromagnetic service.

32. The modular system according to claim 31 wherein the standardized electromagnetic service interface is integral with the host.

33. The modular system according to claim 23 wherein the host comprises a door with a peripheral edge, and the host electromagnetic service interface has a horizontal orientation and is provided on the peripheral edge.

34. The modular system according to claim 23 wherein the host comprises a door with a vertical face, and the host electromagnetic service interface has a vertical orientation and is provided on the vertical face.

35. The modular system according to claim 23 wherein the host comprises a wall.

* * * * *

UNITED STATES PATENT AND TRADEMARK OFFICE
CERTIFICATE OF CORRECTION

PATENT NO.        : 8,212,430 B2
APPLICATION NO.   : 12/643331
DATED             : July 3, 2012
INVENTOR(S)       : Richard McCoy Page 1 of 1

It is certified that error appears in the above-identified patent and that said Letters Patent is hereby corrected as shown below:

Col. 19, lines 9 - 12, Claim 13: "The adapter according to claim 6 wherein the host electromagnetic service interfaces and the electromagnetic service interface of the second member face opposing directions when the second member is in the first orientation." - should be Claim 13: -- The adapter according to claim 6 wherein the host electromagnetic service interface and the electromagnetic service interface of the second member face opposing directions when the second member is in the first orientation. --

Signed and Sealed this
Twenty-third Day of October, 2012

David J. Kappos
*Director of the United States Patent and Trademark Office*